United States Patent
Chen et al.

(10) Patent No.: US 11,652,053 B2
(45) Date of Patent: May 16, 2023

(54) SEMICONDUCTOR DEVICE AND METHOD FOR FORMING THE SAME

(71) Applicant: Taiwan Semiconductor Manufacturing Co., Ltd., Hsinchu (TW)

(72) Inventors: Kuo-Ju Chen, Taichung (TW); Chun-Hsien Huang, Hsinchu (TW); Su-Hao Liu, Jhongpu Township (TW); Liang-Yin Chen, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 96 days.

(21) Appl. No.: 17/171,320

(22) Filed: Feb. 9, 2021

(65) Prior Publication Data

US 2021/0335719 A1     Oct. 28, 2021

Related U.S. Application Data

(60) Provisional application No. 63/016,346, filed on Apr. 28, 2020.

(51) Int. Cl.
*H01L 23/532* (2006.01)
*H01L 21/3215* (2006.01)
*H01L 21/768* (2006.01)
*H01L 23/522* (2006.01)

(52) U.S. Cl.
CPC .... *H01L 23/53242* (2013.01); *H01L 21/3215* (2013.01); *H01L 21/76883* (2013.01); *H01L 23/5226* (2013.01)

(58) Field of Classification Search
CPC .......... H01L 23/53242; H01L 23/5226; H01L 21/3215; H01L 21/76883
USPC ....................................... 257/741
See application file for complete search history.

(56) References Cited

U.S. PATENT DOCUMENTS

| | | | |
|---|---|---|---|
| 2018/0166329 A1 | 6/2018 | Huang et al. | |
| 2019/0305107 A1 | 10/2019 | Chen et al. | |
| 2021/0264959 A1* | 8/2021 | Rabkin | H01L 29/778 |

FOREIGN PATENT DOCUMENTS

TW          201942977 A     11/2019

* cited by examiner

*Primary Examiner* — Tu-Tu V Ho
(74) *Attorney, Agent, or Firm* — Slater Matsil, LLP

(57) ABSTRACT

A semiconductor device includes a first dielectric layer disposed over a substrate and a conductive feature, a doped dielectric layer disposed over the first dielectric layer, a first metal portion disposed in the first dielectric layer and in contact with the conductive feature, and a doped metal portion disposed over the first metal portion. The first metal portion and the doped metal portion include a same noble metal material. The doped dielectric layer and the doped metal portion include same dopants. The dopants are bonded to the noble metal material.

20 Claims, 29 Drawing Sheets

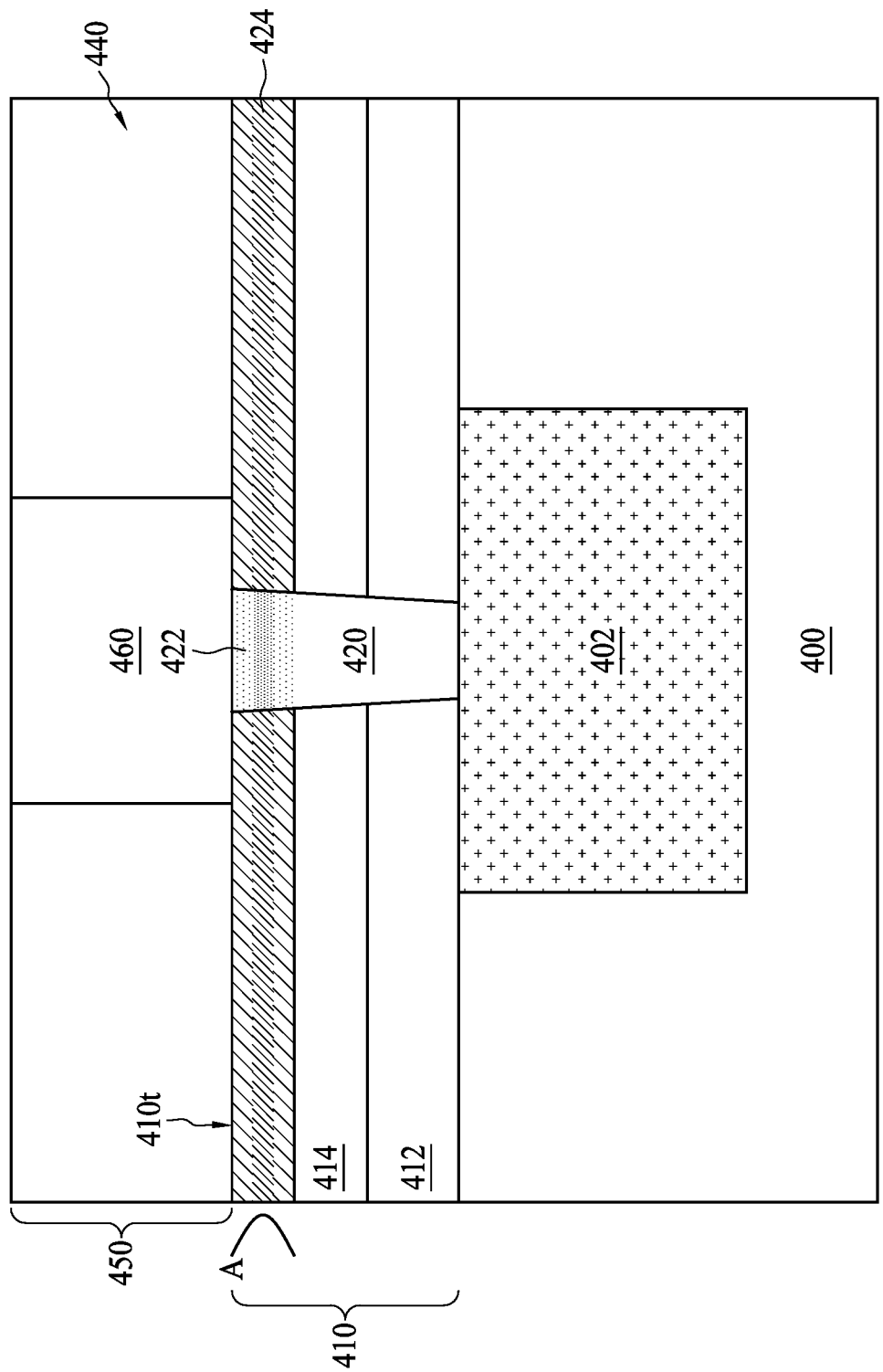

SEMICONDUCTOR DEVICE AND METHOD FOR FORMING THE SAME

PRIORITY DATA

This patent claims the benefit of U.S. Provisional Patent Application No. 63/016,346 filed Apr. 28, 2020, the entire disclosure of which is hereby incorporated by reference.

BACKGROUND

The semiconductor integrated circuit (IC) industry has experienced rapid growth. Technological advances in IC materials and design have produced continuous improvements in generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Thus, there is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 9A to 9F are schematic drawings illustrating various stages in a method for forming a semiconductor device according to aspects of one or more embodiments of the present disclosure.

DETAILED DESCRIPTION

Figure 1:
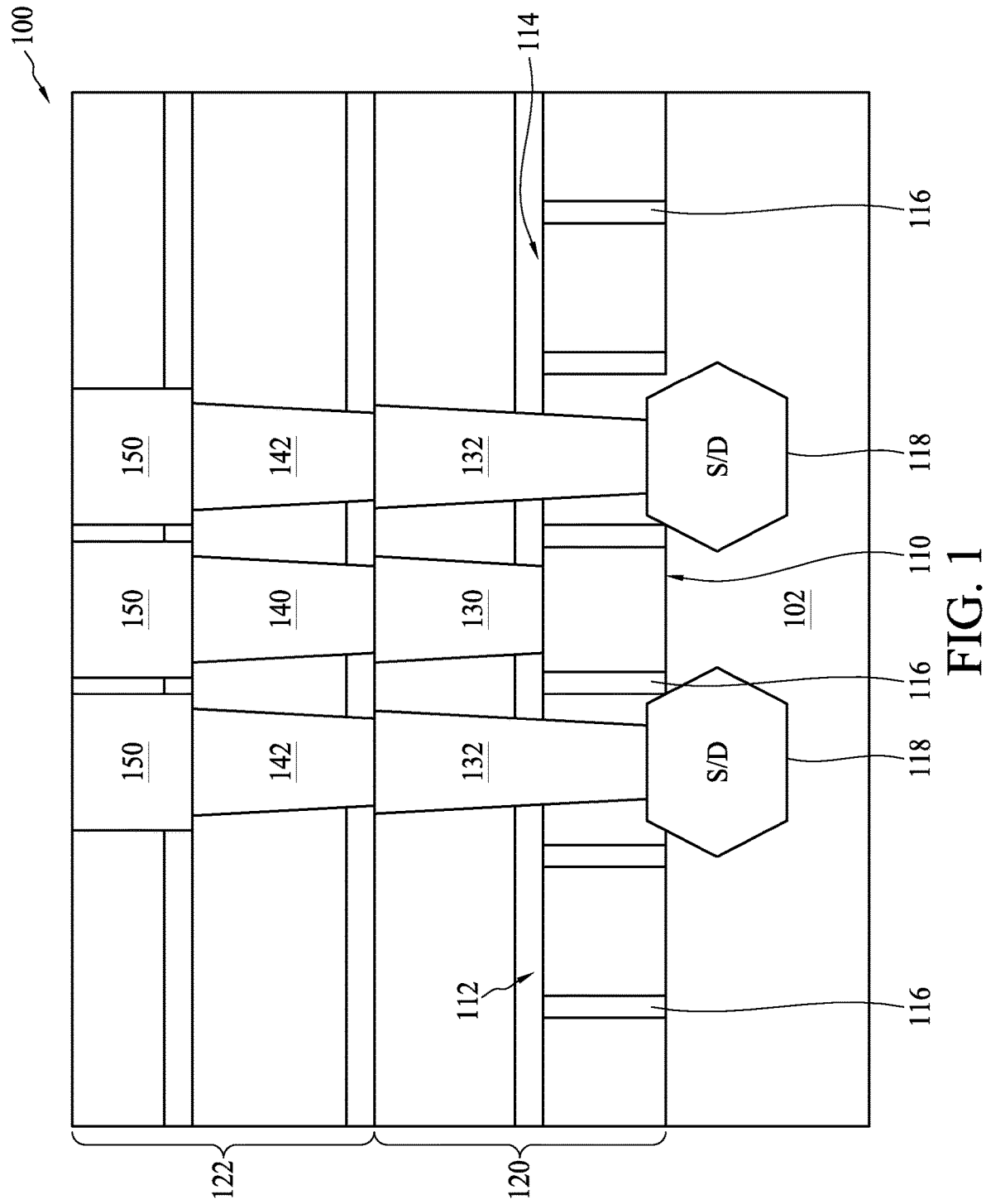
FIG. 1 is a fragmentary cross-sectional view of a semiconductor structure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

IC manufacturing process flow can typically be divided into three categories: front-end-of-line (FEOL), middle-end-of-line (MEOL) and back-end-of-line (BEOL). FEOL generally encompasses processes related to fabrication of IC devices, such as transistors. For example, FEOL processes can include forming isolation structures for isolating IC devices, gate structures, and source and drain structures (also referred to as source/drain structures) that form a transistor. MEOL generally encompasses processes related to fabrication of connecting structures (also referred to as contacts or plugs) that connect to conductive features (or conductive regions) of the IC devices. For example, MEOL processes can include forming connecting structures that connect to the gate structures and connecting structures that connect to the source/drain structures. BEOL generally encompasses processes related to fabrication of multilayer interconnect (MLI) structures that electrically connect the IC devices and the connecting structures fabricated by FEOL and MEOL. Accordingly, operation of the IC devices can be enabled. As mentioned above, the scaling down processes have increased the complexity of processing and manufacturing ICs. For example, in some comparative approaches, ruthenium (Ru), which has less resistivity, is used to form the connecting structures formed by MEOL in order to reduce plug contact resistance, but the Ru-containing connecting structure has presented yield and cost challenges as the connecting structure become more compact with ever-shrinking IC feature size.

Embodiments such as those discussed herein provide a semiconductor device including a connecting structure and a method for forming a semiconductor device to mitigate a bottom metal-loss issue that may occur from metal diffusion from a lower metal layer during an anneal. In some embodiments, an implantation is performed after the disposing of the metal layer to form a barrier layer within the conductive material. In some embodiments, ions implanted into the conductive material are bonded to the conductive material to form the diffusion barrier layer, such that metal diffusion can be obstructed or reduced by the diffusion barrier layer. Accordingly, the bottom metal loss issue caused by metal diffusion can be mitigated or reduced.

FIG. 1 is a fragmentary cross-sectional view of a semiconductor structure 100, in portion or entirety, according to various aspects of some embodiments of the present disclosure. The semiconductor structure 100 can be included in a microprocessor, a memory, and/or another IC device. In some embodiments, the semiconductor structure 100 is a portion of an IC chip, a system on chip (SoC), or a portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, other suitable components, or combinations thereof. The transistors may be planar transistors or multi-gate transistors, such as fin-like FETs (FinFETs). FIG. 1 has been simplified for the sake of clarity to better illustrate the inventive concepts of the present disclosure. Additional features can be added in the semiconductor structure 100, and some of the features described below can be replaced, modified, or eliminated in other embodiments of the semiconductor structure 100.

In some embodiments, the semiconductor structure 100 includes a substrate (wafer) 102. In some embodiments, the substrate 102 includes silicon. Alternatively or additionally, the substrate 102 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 102 includes one or more group III-V materials, one or more group II-IV materials, or combinations thereof. In some implementations, the substrate 102 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 can include various doped regions (not shown) configured according to design requirements of a device, such as p-type doped regions, n-type doped regions, or combinations thereof. P-type doped regions (for example, p-type wells) include p-type dopants, such as boron, indium, another p-type dopant, or combinations thereof. N-type doped regions (for example, n-type wells) include n-type dopants, such as phosphorus, arsenic, another n-type dopant, or combinations thereof. In some implementations, the substrate 102 includes doped regions formed with a combination of p-type dopants and n-type dopants. The various doped regions can be formed directly on and/or in the substrate 102, for example, providing a p-well structure, an n-well structure, a dual-well structure, a raised structure, or combinations thereof. An ion implantation process, a diffusion process, and/or another suitable doping process can be performed to form the various doped regions.

Isolations (not shown) can be formed over and/or in the substrate 102 to electrically isolate various regions, such as various device regions, of the semiconductor structure 100. For example, the isolations can define and electrically isolate active device regions and/or passive device regions from each other. The isolations can include silicon oxide, silicon nitride, silicon oxynitride, another suitable isolation material, or combinations thereof. Isolation features can include different structures, such as shallow trench isolation (STI) structures, deep trench isolation (DTI) structures, and/or local oxidation of silicon (LOCOS) structures.

Various gate structures can be disposed over the substrate 102, such as gate structures 110, 112 and 114. In some embodiments, one or more gate structures 110, 112 and 114 can interpose a source region and a drain region, where a channel region is defined between the source region and the drain region. In some embodiments, the gate structures 110, 112 and 114 are formed over a fin structure. In some embodiments, the gate structures 110, 112 and 114 include a metal gate structure. In some embodiments, the metal gate structure includes a gate dielectric layer and a gate electrode. The gate dielectric layer can be disposed over the substrate 102, and the gate electrode is disposed on the gate dielectric layer. The gate dielectric layer includes a dielectric material, such as silicon oxide, high-k dielectric material, another suitable dielectric material, or combinations thereof. High-k dielectric material generally refers to dielectric materials having a high dielectric constant, for example, a dielectric constant greater than that of silicon oxide ($k \approx 3.9$). Exemplary high-k dielectric materials include hafnium, aluminum, zirconium, lanthanum, tantalum, titanium, yttrium, oxygen, nitrogen, another suitable constituent, or combinations thereof. In some embodiments, the gate dielectric layer includes a multilayer structure, such as an interfacial layer (IL) including, for example, silicon oxide, and a high-k dielectric layer including, for example, $HfO_2$, $HfSiO$, $HfSiON$, $HfTaO$, $HfTiO$, $HfZrO$, $ZrO_2$, $Al_2O_3$, $HfO_2$—$Al_2O_3$, $TiO_2$, $Ta_2O_5$, $La_2O_3$, $Y_2O_3$, another suitable high-k dielectric material, or combinations thereof.

The gate electrode includes an electrically-conductive material. In some implementations, the gate electrode includes multiple layers, such as one or more work function metal layers and gap-filling metal layers. The work function metal layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, another p-type work function material, or combinations thereof. N-type work function materials include Ti, Al, Ag, Mn, Zr, TiAl, TiAlC, TaC, TaCN, TaSiN, TaAl, TaAlC, TiAlN, another n-type work function material, or combinations thereof. The gap-filling metal layer can include a suitable conductive material, such as Al, W, and/or Cu.

The gate structures 110, 112 and 114 can further include spacers 116, which are disposed adjacent to (for example, along sidewalls of) the gate structures 110, 112 and 114. The spacers 116 can be formed by any suitable process and include a dielectric material. The dielectric material can include silicon, oxygen, carbon, nitrogen, another suitable material, or combinations thereof (for example, silicon oxide, silicon nitride, silicon oxynitride, or silicon carbide). In some embodiments, the spacers 116 can include a multilayer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate structures 110, 112 and 114.

Implantation, diffusion, and/or annealing processes can be performed to form lightly-doped source and drain (LDD) features and/or heavily-doped source and drain (HDD) features in the substrate 102 before and/or after the forming of the spacers 116.

In some embodiments, source/drain regions S/D of the device can include epitaxial structures 118. For example, a semiconductor material is epitaxially grown on the substrate 102, forming epitaxial source/drain structures 118 over a source region and a drain region of the substrate 102. Accordingly, the gate structure 110, the epitaxial source/drain structure 118 and a channel region defined between the epitaxial source/drain structures 118 form a device such as a transistor. In some embodiments, the epitaxial source/drain structures 180 can surround source/drain regions of a fin structure. In some embodiments, the epitaxial source/drain structures 180 can replace portions of the fin structure. The epitaxial source/drain structures 180 are doped with n-type dopants and/or p-type dopants. In some embodiments, where the transistor is configured as an n-type device (for example, having an n-channel), the epitaxial source/drain structure 180 can include silicon-containing epitaxial layers or silicon-carbon-containing epitaxial layers doped with phosphorous, another n-type dopant, or combinations thereof (for example, forming Si:P epitaxial layers or Si:C:P epitaxial layers). In alternative embodiments, where the transistor is configured as a p-type device (for example, having a p-channel), the epitaxial source/drain structures 180 can include silicon-and-germanium-containing epitaxial layers doped with boron, another p-type dopant, or combinations thereof (for example, forming Si:Ge:B epitaxial layers). In some embodiments, the epitaxial source/drain structures 180 include materials and/or dopants that achieve desired tensile stress and/or compressive stress in the channel region.

As shown in FIG. 1, a plurality of dielectric layers 120, 122 and 124 can be disposed over the substrate 102. The dielectric layers 120, 122 and 124 can include a dielectric material including, for example, silicon oxide, silicon nitride, silicon oxynitride, TEOS formed oxide, PSG, BPSG, low-k dielectric material, another suitable dielectric material, or combinations thereof. Exemplary low-k dielectric materials include FSG, carbon-doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, another low-k dielectric material, or combinations thereof. As shown in FIG. 1, the dielectric layer 120 may cover the source/drain region S/D, the spacers 116 and the gate structures 110, 112 and 114. In some embodiments, the dielectric layer 120 may be referred to as an interlayer dielectric (ILD) layer. In some embodiments, the dielectric layers 122 and 124 may be referred to as an interlayer dielectric (ILD) layer or an inter-metal dielectric (IMD) layer.

In some embodiments, one or more connecting structures 130, 132 can be formed over the source/drain region S/D and the gate structure 110, as shown in FIG. 1. The connecting structure 130 is disposed on the gate structure 110, such that the gate structure 110 can be connected to a back-end-of-line (BEOL) interconnection (not shown) through the connecting structure 130. The connecting structure 132 can be referred to as a metal-to-device (MD) or a metal-to-drain (MD) contact, which generally refer to a contact to the source/drain regions S/D. As shown in FIG. 1, the connecting structures 132 can be disposed on the epitaxial source/drain structures 118, respectively, such that the epitaxial source/drain structures 118 can be connected to the BEOL interconnection through the connecting structures 132. Accordingly, the FEOL structures can be electrically connected to the BEOL interconnection through the connecting structures 130, 132, which can also be referred to as the MEOL interconnect structures.

Still referring to FIG. 1, connecting structures 140, 142 can be formed on the connecting structures 130, 132, and conductive features 150 can be formed on the connecting structures 140, 142. The connecting structures 140, 142 electrically connect the connecting structure 130, 132 to the conductive features 150. In some embodiments, the connecting structures 140, 142 are referred to as vias (V) and the conductive features 150 are referred to as metal lines (M) in the BEOL interconnection. In some embodiments, the BEOL interconnection includes a dielectric layer stack 122, and vias and metal lines are formed in the dielectric layer stack.

Figure 2:
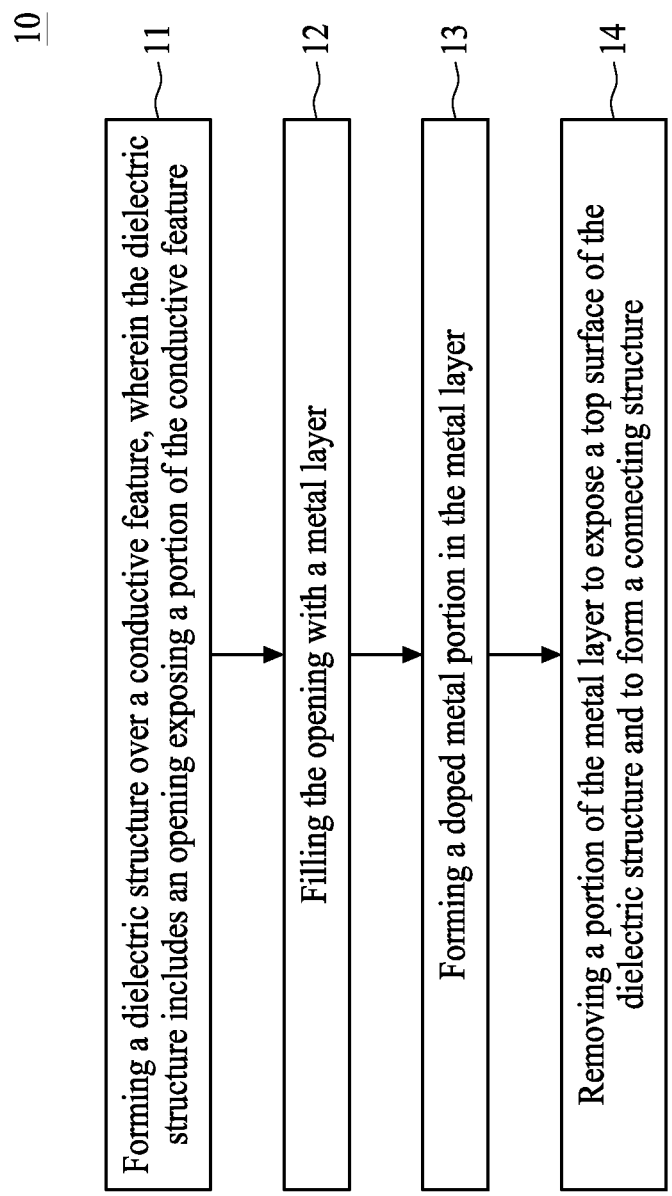
FIG. 2 is a flowchart of a method for forming a semiconductor device according to various aspects of the present disclosure.

FIG. 2 is a flowchart representing a method for forming a semiconductor device 10 according to aspects of the present disclosure. In some embodiments, the method for forming the semiconductor device 10 includes a number of operations (11, 12, 13 and 14). The methods for forming the semiconductor device 10 will be further described according to one or more embodiments. It should be noted that the operations of the method for forming the semiconductor device 10 may be rearranged or otherwise modified within the scope of the various aspects. It should further be noted that additional processes may be provided before, during, and after the method 10, and that some other processes may be only briefly described herein. In some embodiments, the method for forming the semiconductor device 10 can be used to form the connecting structure 130, 132 in the MEOL structure. In other embodiments, the method for forming the semiconductor device 10 can be used to form the connecting structure 140, 142 in the BEOL interconnection.

Figure 3A:
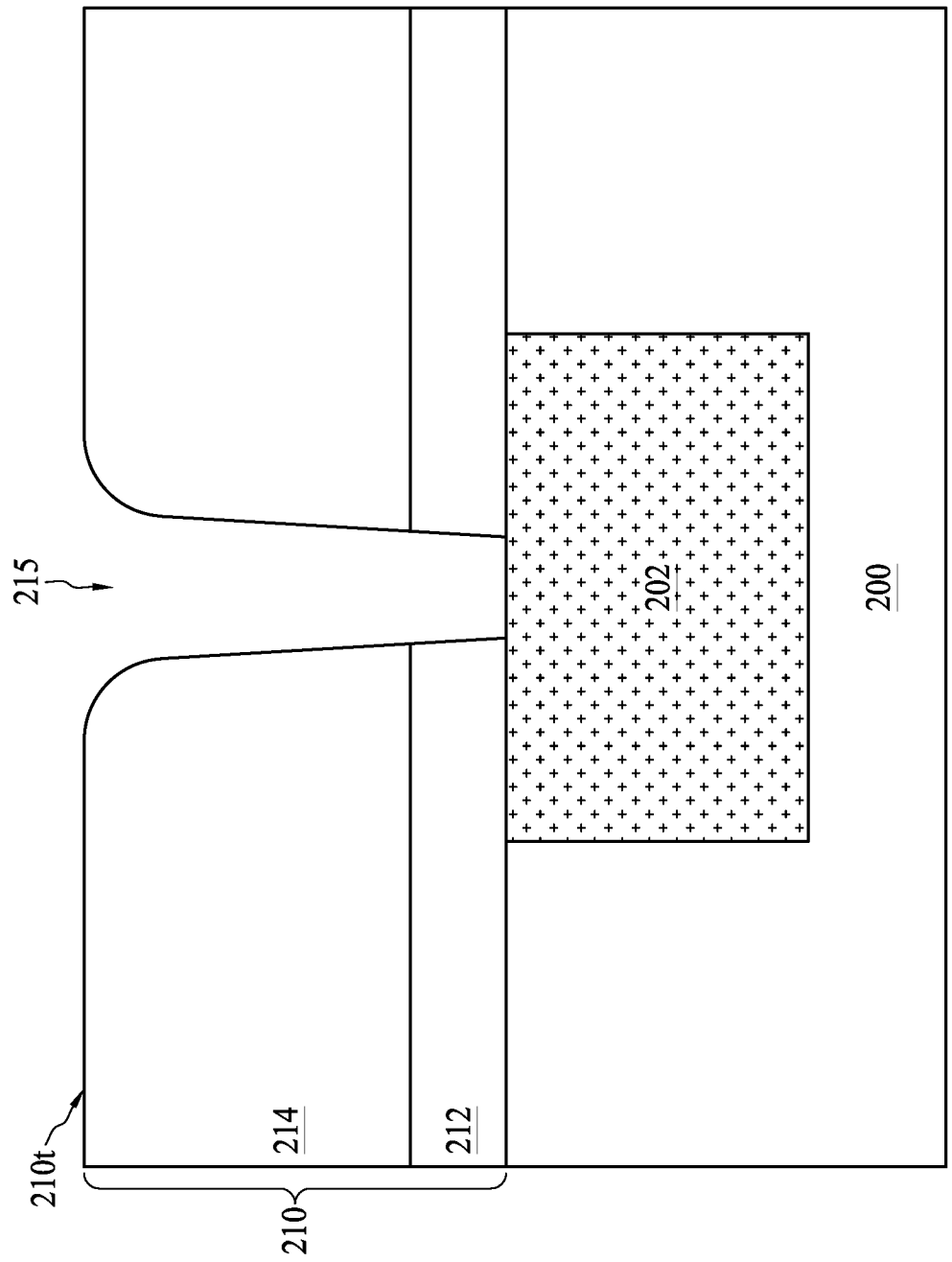
FIGS. 3A to 3F are schematic drawings illustrating various stages in a method for forming a semiconductor device according to aspects of one or more embodiments of the present disclosure.

FIGS. 3A to 3F are schematic drawings illustrating various stages in the method for forming the semiconductor device 10 according to aspects of one or more embodiments of the present disclosure. In some embodiments, a substrate 200 can be received. The substrate 200 can be the substrate 102 shown in FIG. 1, but the disclosure is not limited thereto. In some embodiments, the substrate 200 can include a semiconductor device, such as the transistor shown in FIG. 1, but the disclosure is not limited thereto. As shown in FIG. 3A, the substrate 200 may include a conductive feature 202 disposed therein. In some embodiments, the conductive feature 202 can be a FEOL feature similar to the metal gate 110 or the source/drain region S/D depicted in FIG. 1. In some embodiments, the conductive feature 202 can be a MEOL feature, such as a cobalt-containing device-level contact similar to the connecting structure 130, 132 depicted in FIG. 1. Additionally, the substrate 200 may include one or more dielectric layers. For example, in some embodiments, the conductive feature 202 can be a BEOL feature, such as cobalt-containing line of a metal line (M) feature 150 depicted in FIG. 1.

In operation 11, a dielectric structure 210 is formed over the substrate 200 and the conductive feature 202. In some embodiments, the dielectric structure 210 can include a single layer. In some embodiments, the dielectric structure can include a multilayered structure. For example, as shown in FIG. 3A, the dielectric structure 210 can include at least a first dielectric layer 212 and a second dielectric layer 214 sequentially stacked over the substrate 200 and the conductive feature 202. The first dielectric layer 212 and the second dielectric layer 214 can include different dielectric materials. For example, the first dielectric layer 212 can be a contact etch-stop layer (CESL), and the second dielectric layer can be an ILD layer or an IMD layer. In some embodiments, the CESL can include silicon nitride, silicon oxynitride, and the like. The ILD layer or the IMD layer can include materials as mentioned above.

Still referring to FIG. 3A, in operation 11, an opening 215 can be formed in the dielectric structure 210. In some embodiments, the opening 215 penetrates the dielectric structure 210 from a top surface 210t to a bottom of the dielectric structure 210. Accordingly, a portion of the conductive feature 202 is exposed through the opening 215. The opening 215 can be formed using a lithographic operation with masking technologies and anisotropic etch operation (e.g., plasma etching or reactive ion etching), but the disclosure is not limited thereto.

Figure 3B:
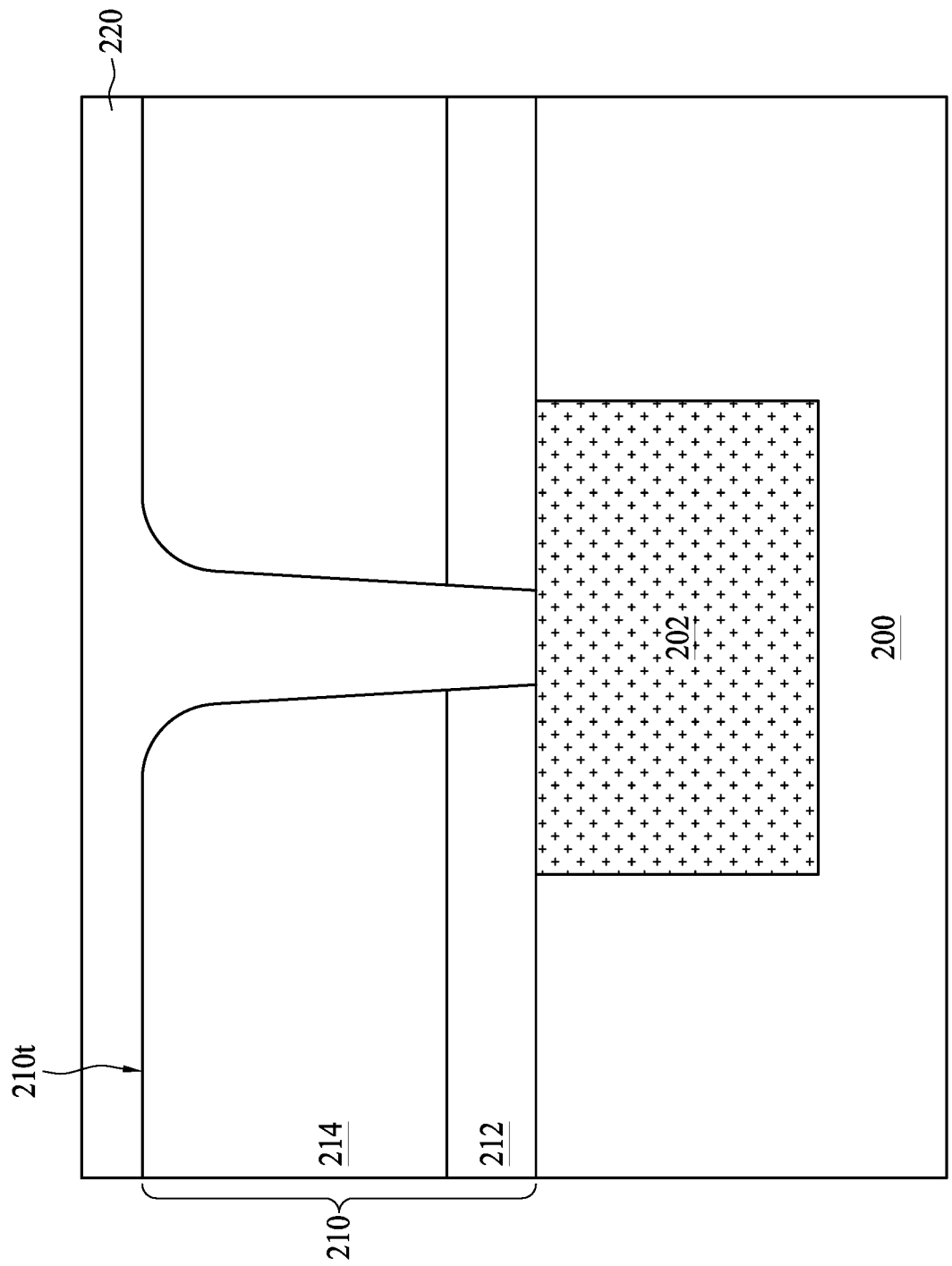

Referring to FIG. 3B, in operation 12, a metal layer 220, such as a noble metal layer, can be formed to fill the opening 215, but the disclosure is not limited thereto. The noble metal layer can include rhenium (Re), rhodium (Rh) and ruthenium (Ru). The metal layer 220 extends from the top surface 210t of the dielectric structure 210 to the bottom of the dielectric structure 210. The metal layer 220 penetrates the second dielectric layer 214 and the first dielectric layer 212 to contact the exposed portion of the conductive feature 202. Further, the metal layer 220 covers the top surface 210t of the dielectric structure 210. In some embodiments, a thickness of the metal layer 220 overlying the top surface 210t of the dielectric structure 210 can be between approximately 1 nanometer and approximately 50 nanometers, but the disclosure is not limited thereto.

It should be noted that in some embodiments, the metal layer 220 can be formed in absence of a liner, a barrier, a seed layer or any intervening layer. Therefore, in such embodiments, the metal layer 220 can be in contact with the dielectric structure 210, but the disclosure is not limited thereto.

Figure 3C:
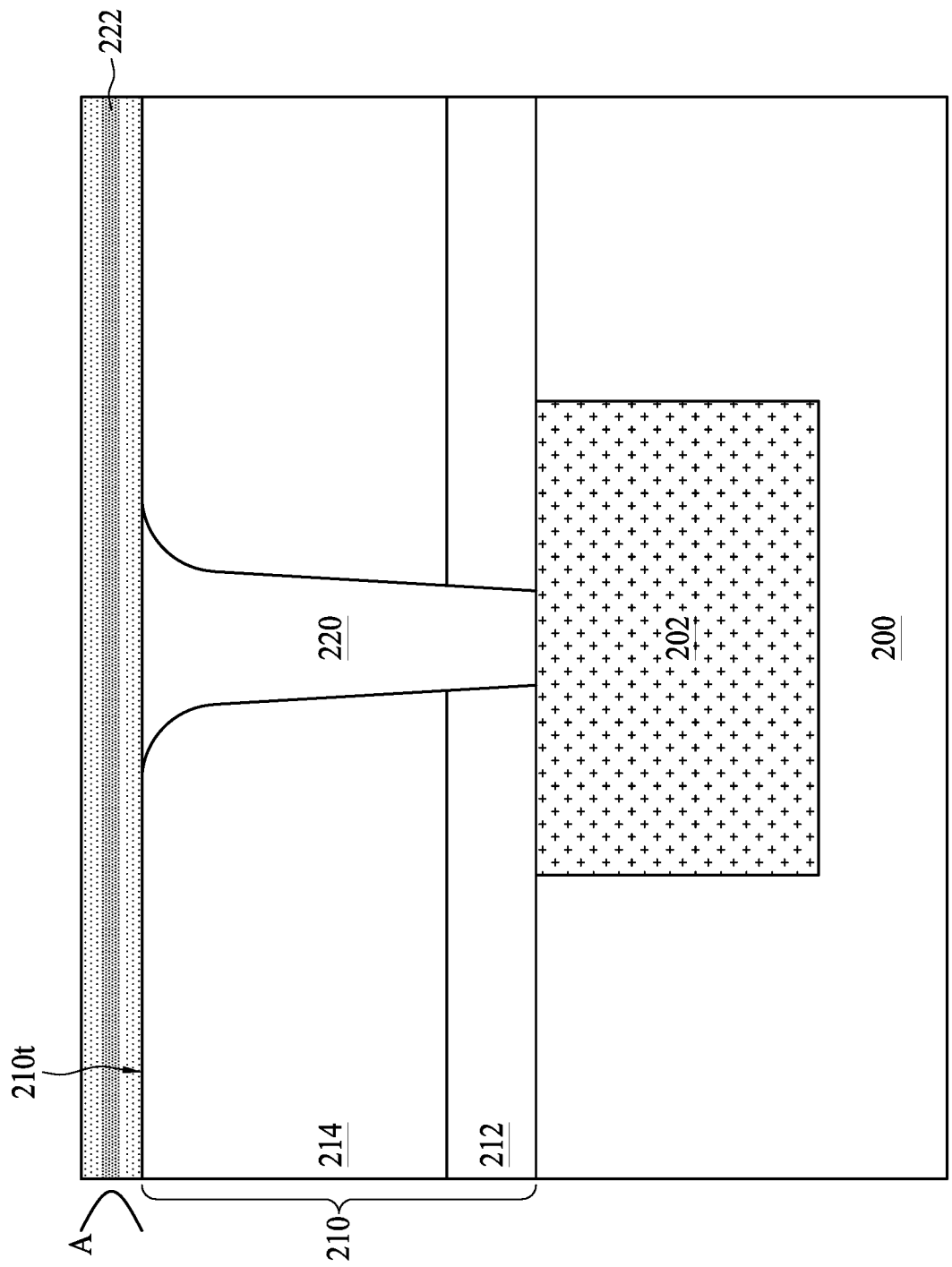

Referring to FIG. 3C, in operation 13, a doped metal portion 222 is formed in the metal layer 220. In some embodiments, the doped metal portion 222 includes phosphorous (P), boron (B), arsenic (As), gallium (Ga), or indium (In), but the disclosure is not limited thereto. The forming of the doped metal portion 222 includes an ion implantation. In some embodiments, a dosage of the ion implantation can be between approximately 1E13 cm$^{-2}$ and approximately 1E16 cm$^{-2}$, an angle of the ion implantation can be between approximately 0 degrees and approximately 60 degrees, and a temperature of the ion implantation can be between approximately −100° C. and approximately 500° C. It should be noted that a depth or a location of the doped metal portion 222 can be determined by an implantation energy of the ion implantation. For example, when the implantation energy of the ion implantation is between approximately 500 eV and approximately 50 KeV, the doped metal portion 222 can be formed in an upper portion of the metal layer 220. In some embodiments, as shown in FIG. 3C, the doped metal portion 222 is formed to cover the top surface 210t of the dielectric structure 210. A distribution of the dopants in the doped metal portion 222 is depicted as the curve A shown in FIG. 3C. In some embodiments, a peak of the distribution curve can be near the middle of the doped metal portion 222, overlying the second dielectric layer 214, but the disclosure is not limited thereto. In some embodiments, a thickness of the doped metal portion 222 can be between approximately 1 nanometer and approximately 50 nanometers, but the disclosure is not limited thereto.

Figure 3D:
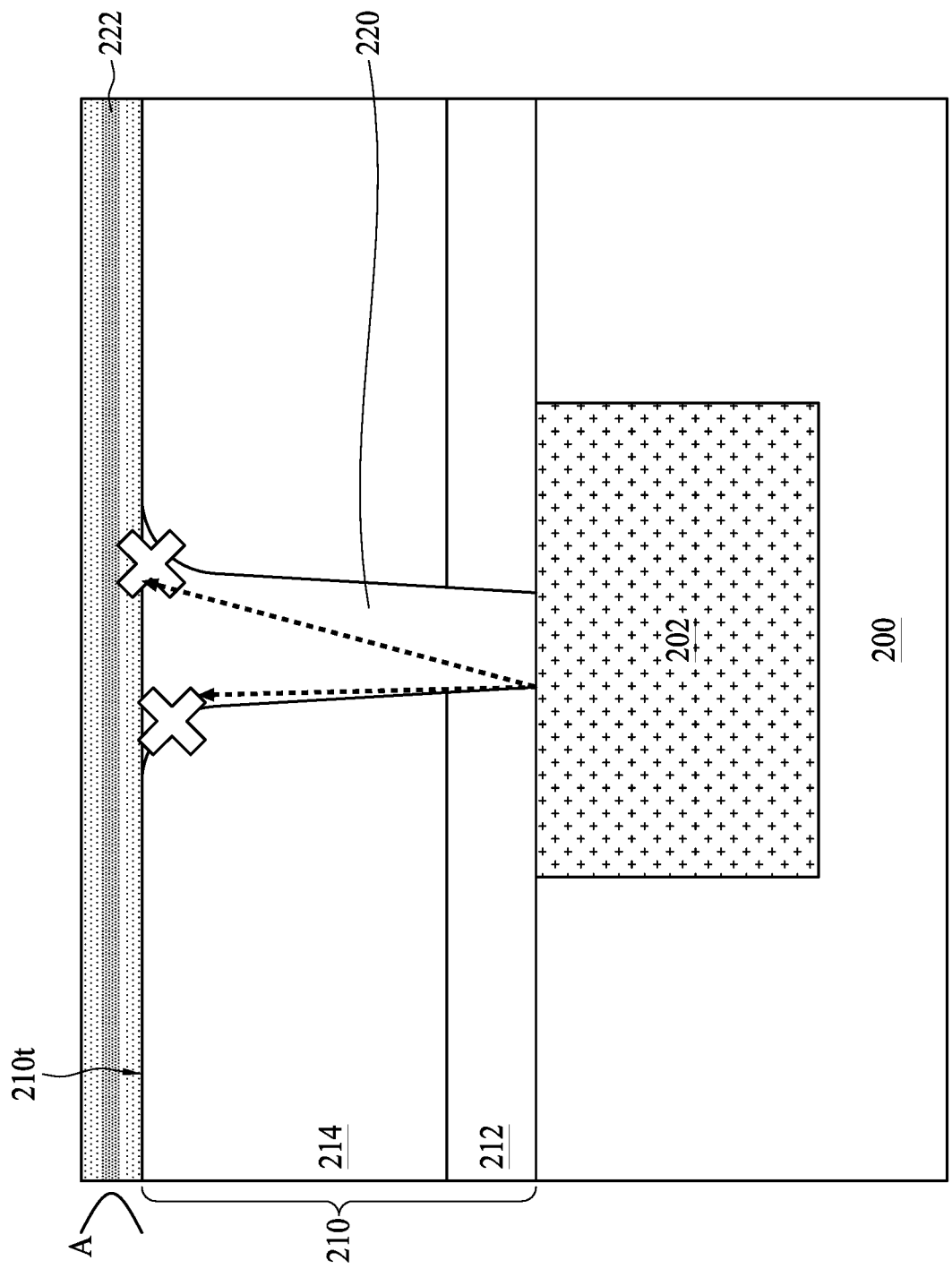
Figure 3E:
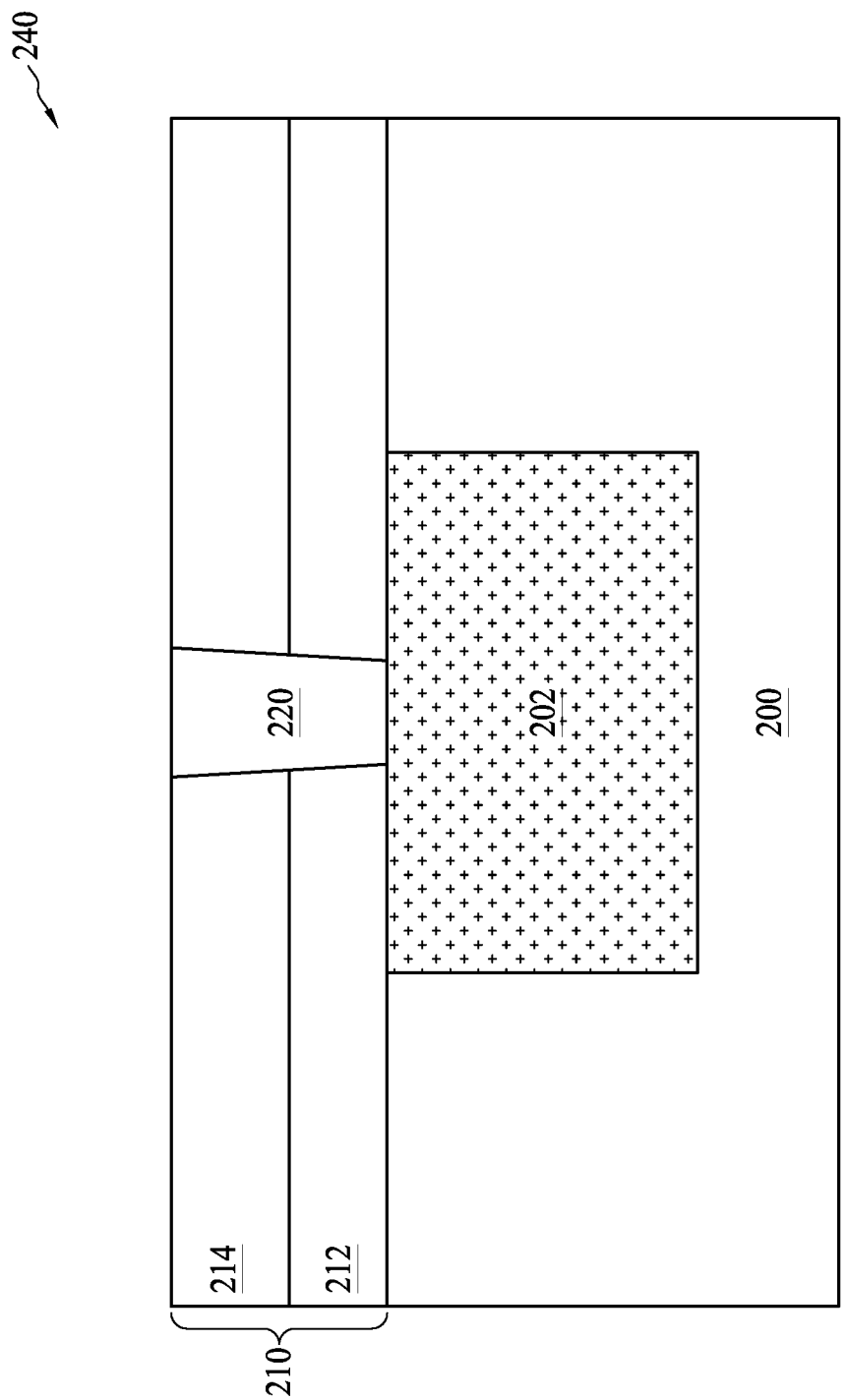

Referring to FIG. 3D, in some embodiments, an anneal is performed to improve the gap-filling results, reduce plug resistance and fix an interface between the dielectric structure 210 and the metal layer 220. In some embodiments, a temperature for the anneal can be ranging from ranging from approximately 100° C. to approximately to 500° C., but the disclosure is not limited thereto. A pressure for the anneal can range from approximately 100 mTorr to approximately 760 mTorr, but the disclosure is not limited thereto. A process duration for the anneal can range from approximately 10 minutes to approximately 120 minutes, but the disclosure is not limited thereto. Further, gas such as nitrogen ($N_2$), hydrogen ($H_2$) helium (He) and/or argon (Ar) can be used in the anneal. During the anneal, metal diffusion may occur, and metal ions may move from the conductive feature 202 to an upper portion of the metal layer 220 along the interface between the dielectric structure 210 and the metal layer 220, or within the metal layer 220. It should be noted that the doped metal portion 222 serves as a barrier layer that helps to obstruct or reduce the metal diffusion, as shown in FIG. 3E. Therefore, the metal-loss issue can be mitigated or reduced.

Referring to FIG. 3E, in operation 14, a portion of the metal layer 220 is removed to expose the top surface 210t of the dielectric structure 210 and form a connecting structure 240. In some embodiments, in operation 14, the doped metal portion 222 and a portion of the dielectric structure 210, such as a portion of the second dielectric layer 214, can be removed. In some embodiments, the removal of the portion of the metal layer 220, the doped metal portion 222 and the portion of the dielectric structure 210 can be performed using a chemical-mechanical polishing (CMP) operation.

Figure 3F:
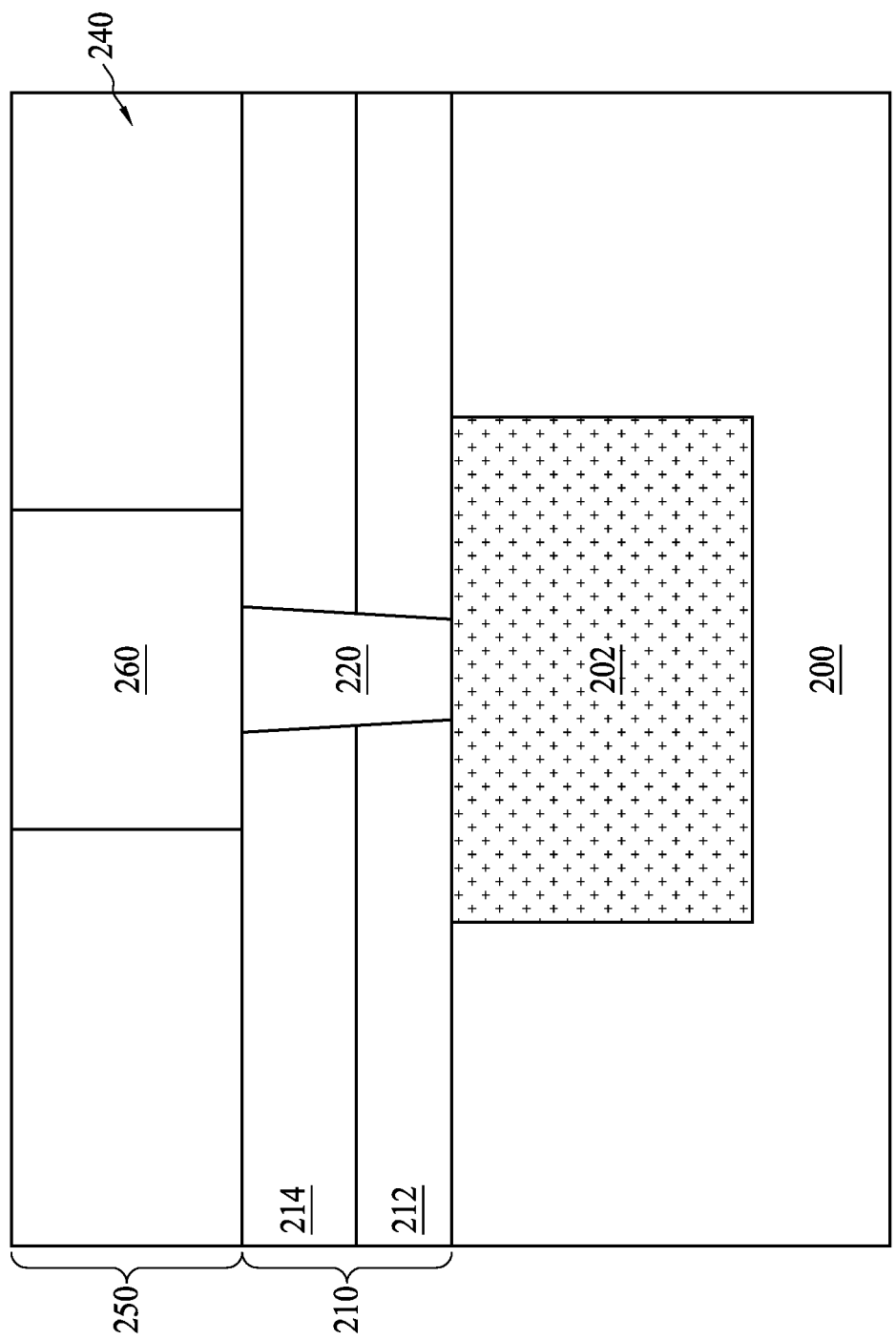

Referring to FIG. 3F, in some embodiments, another dielectric structure 250 can be formed over the dielectric structure 210 and the connecting structure 240. Another conductive feature 260 can be formed in the dielectric structure 250. The conductive feature 260 can be coupled to the connecting structure 240. In some embodiments, the conductive feature 260 can be referred to as the connecting structures 140, 142 in FIG. 1. In some embodiments, the conductive feature 260 can be referred to as the metal line 150 in FIG. 1.

According to the method for forming the semiconductor device 10, the doped metal portion 222 can be formed prior to the removing of the portion of the metal layer 220 and the portion of the dielectric structure 210. The doped metal portion 222 includes the ions that are able to be bonded to Ru. Therefore, the doped metal portion 222 may include ruthenium phosphides, ruthenium borides, and ruthenium arsenide, and serve as a diffusion barrier layer. Accordingly, the metal diffusion can be obstructed by the diffusion barrier layer, and the metal-loss issue can be mitigated. As mentioned above, the thickness of the doped metal portion 222 can be between approximately 1 nanometer and approximately 50 nanometers. When the thickness of the doped metal portion 222 is less than approximately 1 nanometer, the doped metal portion 222 may be too thin to obstruct the metal diffusion. In some alternative approaches, when the thickness of the doped metal portion 222 is greater than approximately 50 nanometers, such thickness may incur greater cost for the removal of the doped metal portion 222.

FIGS. 4A to 4E, 5, and 6A to 6D are schematic drawings illustrating various stages in the method for forming the semiconductor device 10 according to aspects of different embodiments of the present disclosure. It should be understood that same elements in FIGS. 3A to 3F and FIGS. 4A to 4E are depicted by same numerals, and repetitive details may be omitted in the interest of brevity.

Figure 4A:
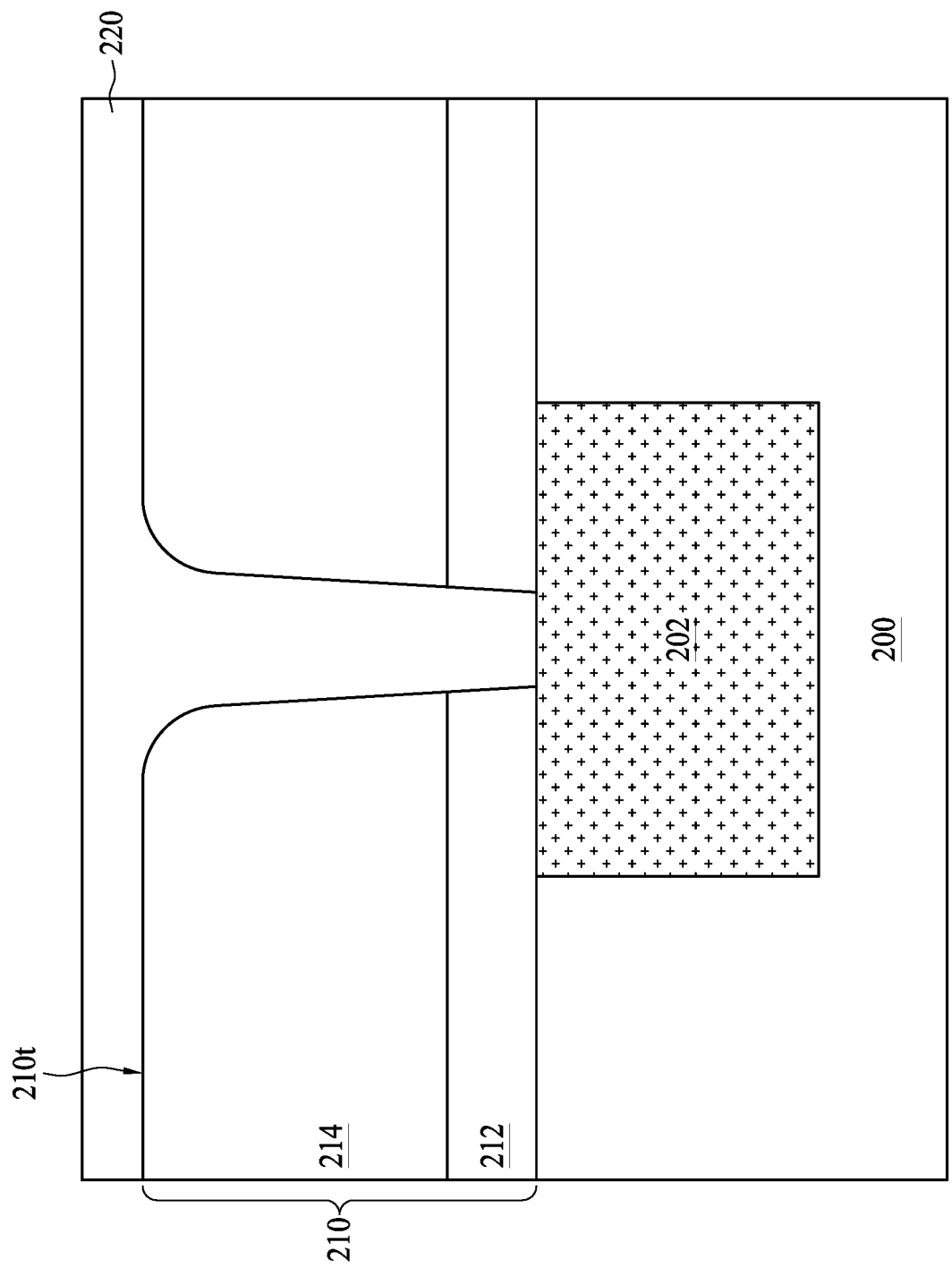
FIGS. 4A to 4E are schematic drawings illustrating various stages in a method for forming a semiconductor device according to aspects of one or more embodiments of the present disclosure.

In some embodiments, a substrate 200 can be received. As shown in FIG. 4A, the substrate 200 may include a conductive feature 202 disposed therein. In operation 11, a dielectric structure 210 is formed over the substrate 200 and the conductive feature 202, and an opening can be formed in the dielectric structure 210. In operation 12, a metal layer 220, such as a noble metal layer, can be formed to fill the opening 215. As shown in FIG. 4A, the metal layer 220 extends from the top surface 210t of the dielectric structure 210 to the bottom of the dielectric structure 210. The metal layer 220 penetrates the second dielectric layer 214 and the first dielectric layer 212 to contact the exposed portion of the conductive feature 202. Further, the metal layer 220 covers the top surface 210t of the dielectric structure 210. As mentioned above, in some embodiments, the metal layer 220 can be formed in the absence of a liner, a barrier, a seed layer or any intervening layer. Therefore, in such embodiments, the metal layer 220 can be in contact with the dielectric structure 210, but the disclosure is not limited thereto.

Figure 4B:
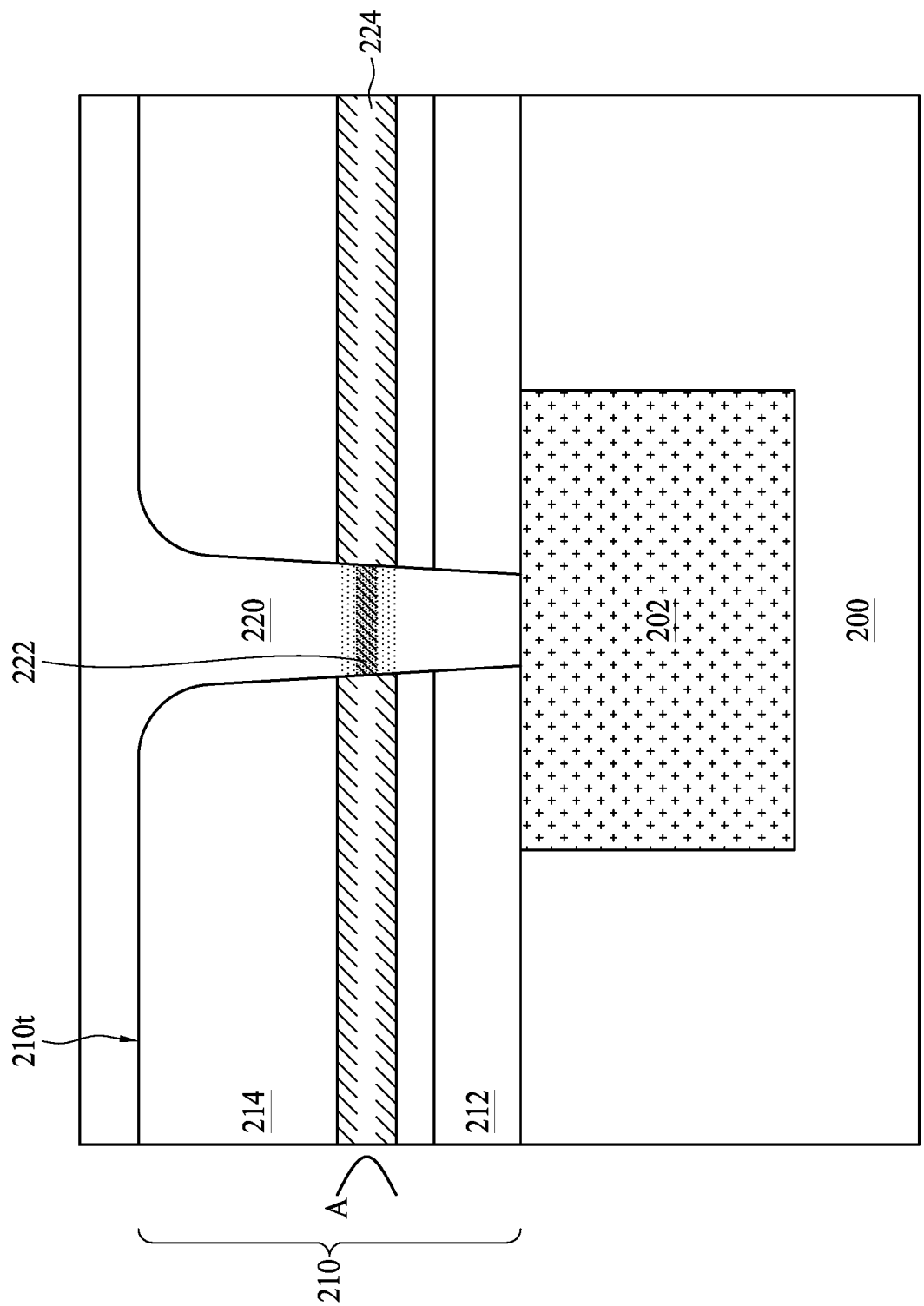

Referring to FIG. 4B, in operation 13, a doped metal portion 222 is formed in the metal layer 220. In some embodiments, the doped metal portion 222 includes phosphorous (P), boron (B), arsenic (As), gallium (Ga), or indium (In), but the disclosure is not limited thereto. In some embodiments, the forming of the doped metal portion 222 includes an ion implantation. A dosage, an angle and a temperature used in the ion implantation can be similar to those described above; therefore, details are omitted for brevity. It should be noted that a depth or a location of the doped metal portion 222 can be determined by an implantation energy of the ion implantation. For example, when the implantation energy of the ion implantation is greater than 50 KeV, the doped metal portion 222 can be formed in a lower portion of the metal layer 220, as shown in FIG. 4B. However, it should be noted that by controlling or adjusting the implantation energy of the ion implantation, the doped metal portion 222 may be separated from the conductive feature 202. When the doped metal portion 222 is in contact with the conductive feature 202, the resistance of the conductive feature 202 may be negatively impacted. In some embodiments, a doped dielectric layer 224 can be formed in the dielectric structure 210 simultaneously with the forming of the doped metal portion 222. Further, the doped dielectric layer 224 and the doped metal portion 222 are substantially aligned with each other, as shown in FIG. 4B. Thus, the doped metal portion 222 is separated from a top surface of the metal layer 220, and the doped dielectric layer 224 is separated from the top surface 210t of the dielectric structure 210. A distribution of the dopants in the doped metal portion 222 and the doped dielectric layer 224 is depicted as the curve A shown in FIG. 4B. In some embodiments, a peak of the distribution curve can be near the middle of the doped metal portion 222, but the disclosure is not limited thereto. In some embodiments, a thickness of the doped metal portion 222 and a thickness of the doped dielectric layer 224 can be between approximately 1 nanometer and approximately 50 nanometers, but the disclosure is not limited thereto.

Figure 6A:
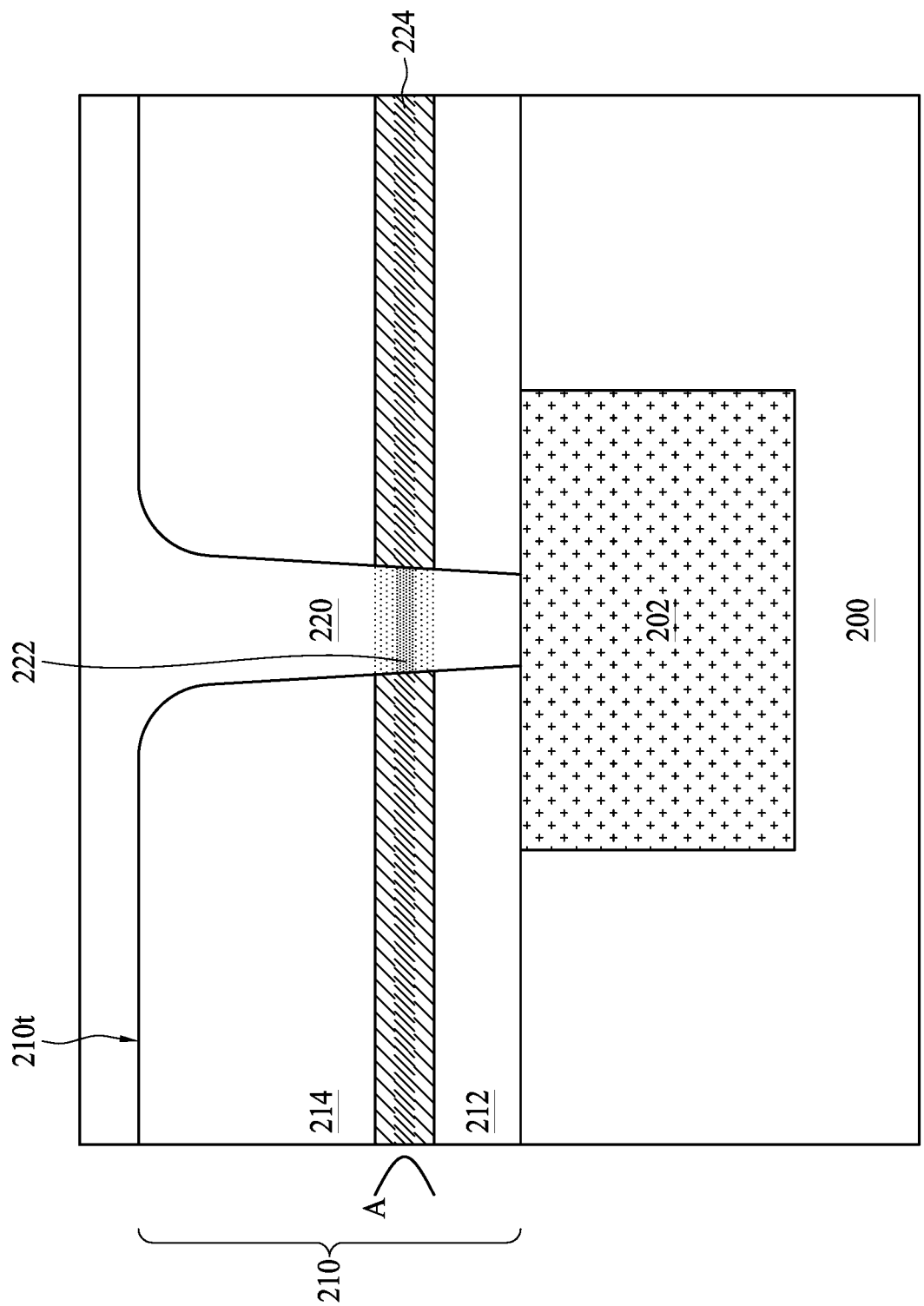
FIGS. 6A to 6D are schematic drawings illustrating various stages in a method for forming a semiconductor device according to aspects of one or more embodiments of the present disclosure.

In some embodiments, the doped dielectric layer 224 is formed in the second dielectric layer 214, and thus a top surface and a bottom surface of the doped dielectric layer 224 are in contact with the second dielectric layer 214, as shown in FIG. 4B. In some embodiments, by adjusting the implantation energy, the doped dielectric layer 224 can be formed in the second dielectric layer 214 and first dielectric layer 212. Thus, a top surface of the doped dielectric layer 224 is in contact with the second dielectric layer 214 while a bottom surface of the doped dielectric layer 224 is in contact with the first dielectric layer 212, as shown in FIG. 6A.

Figure 4C:
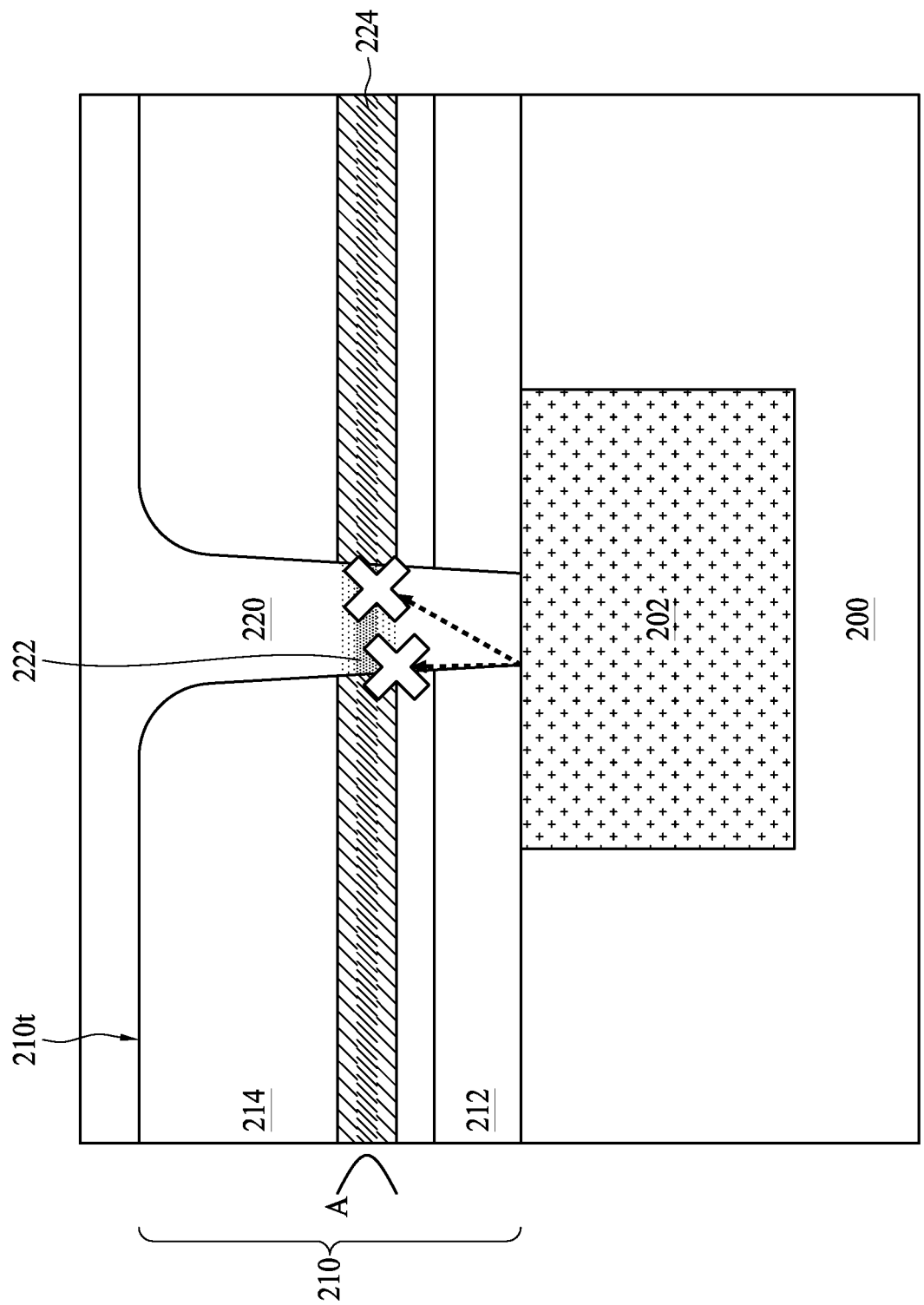
Figure 6B:
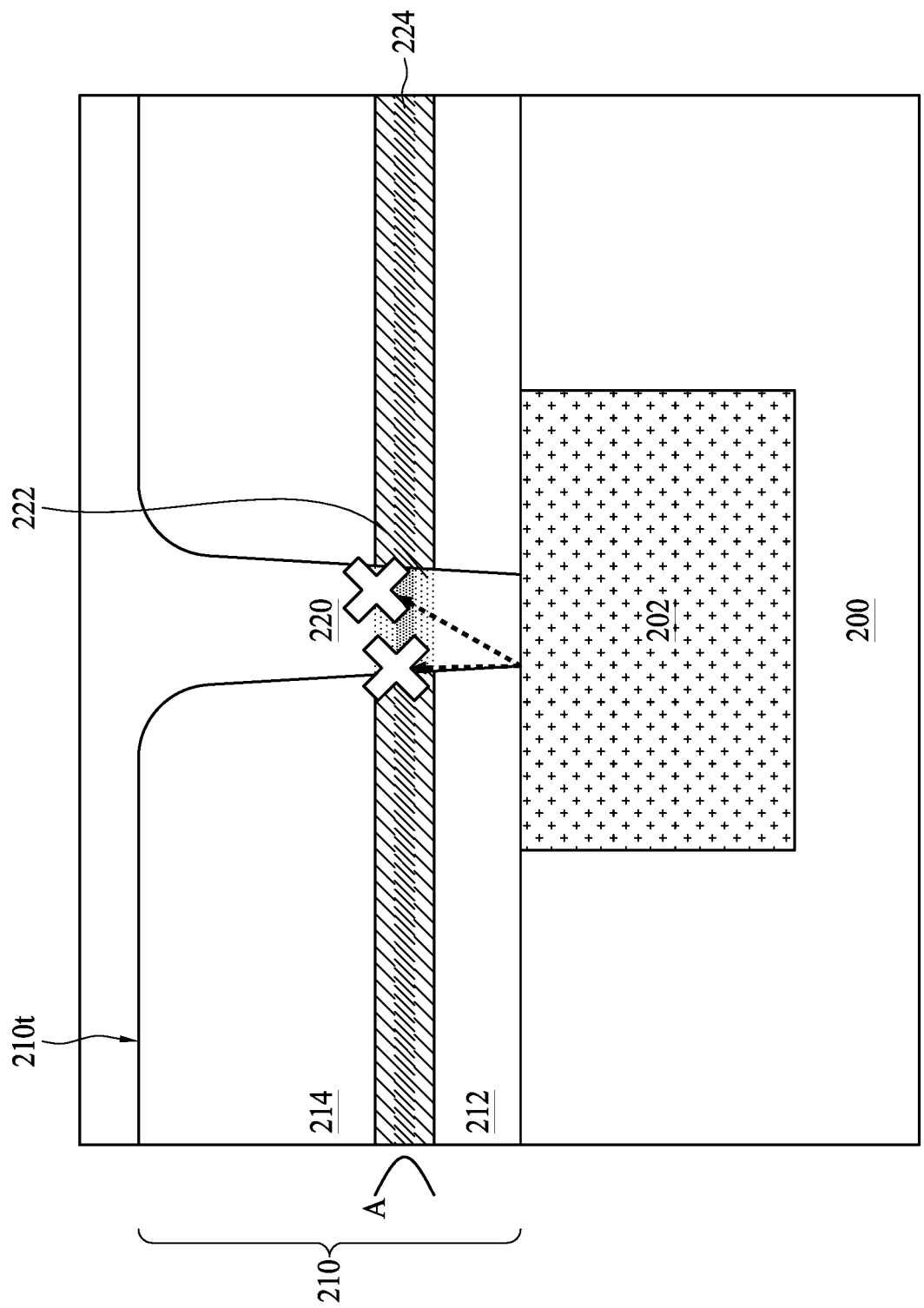

Referring to FIGS. 4C and 6B, in some embodiments, an anneal is performed to improve the gap-filling results, reduce plug resistance and fix the interface between the dielectric structure 210 and the metal layer 220. During the anneal, metal diffusion may occur, and metal ions may move from the conductive feature 202 to an upper portion of the metal layer 220 along the interface between the dielectric structure 210 and the metal layer 220, or within the metal layer 220. It should be noted that the doped metal portion 222 and the doped dielectric layer 224 serve as a barrier layer that helps to obstruct or reduce the metal diffusion, as shown in FIGS. 4C and 6B. Therefore, the metal-loss issue can be mitigated or reduced.

Figure 4D:
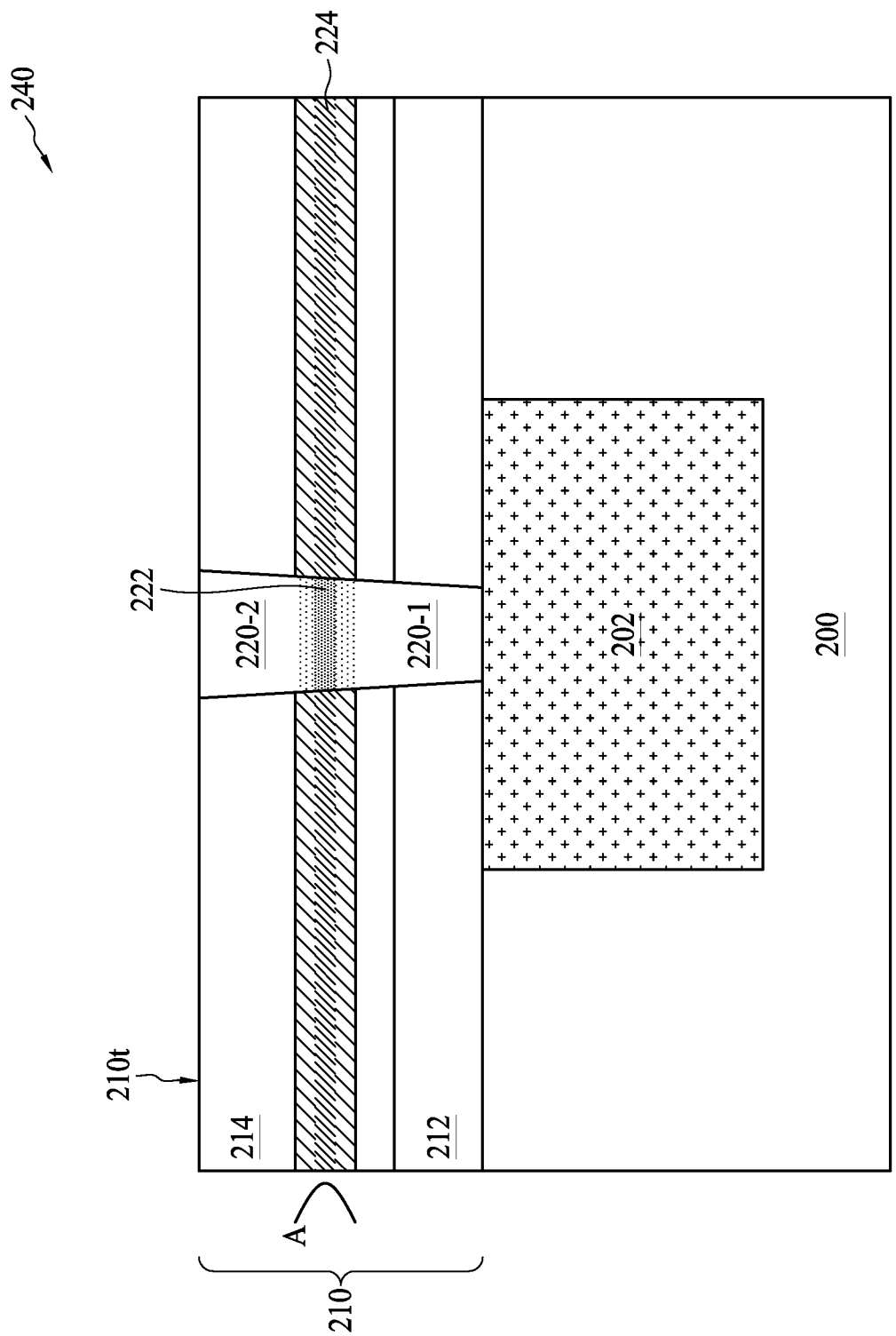
Figure 4E:
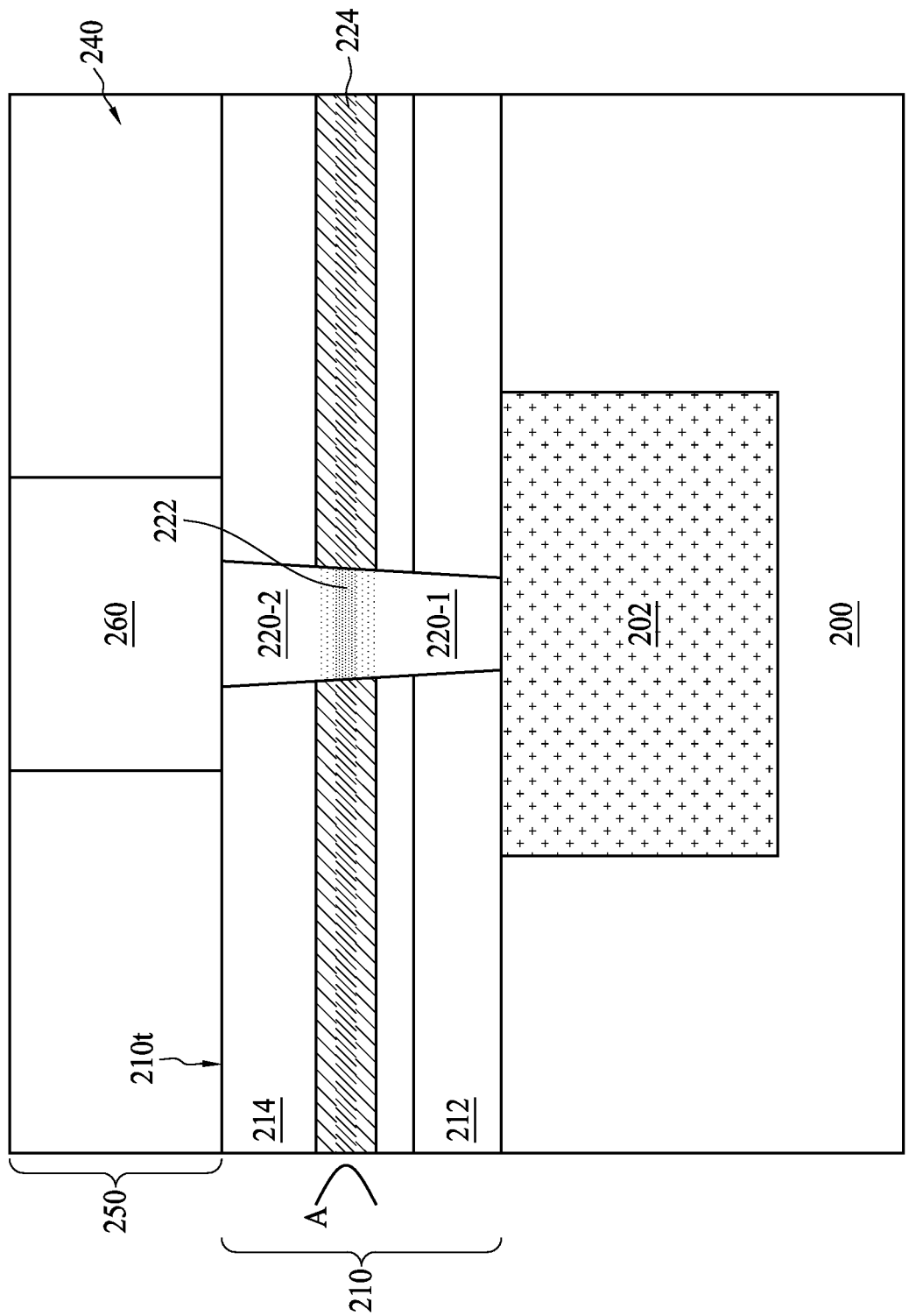
Figure 6C:
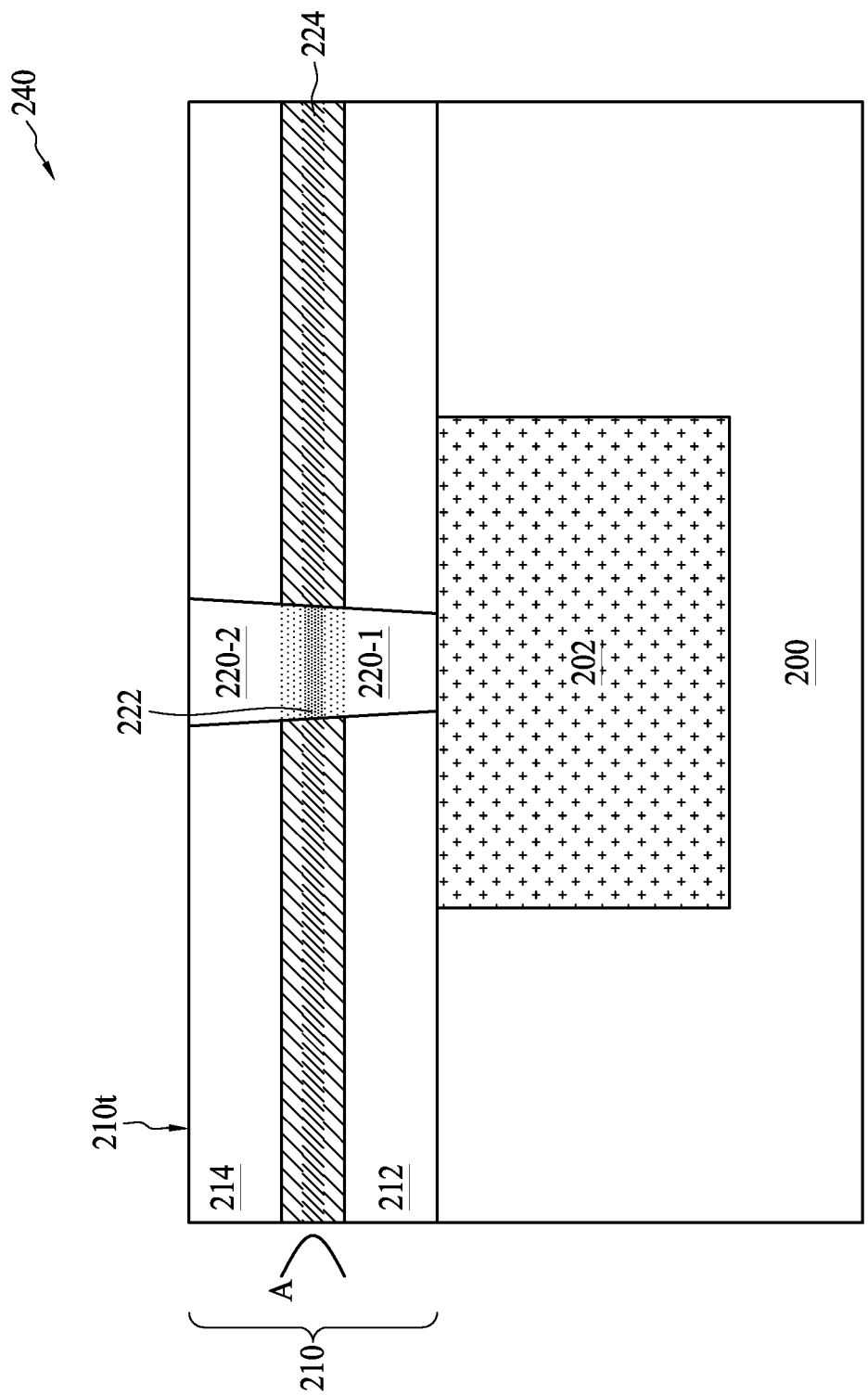
Figure 6D:
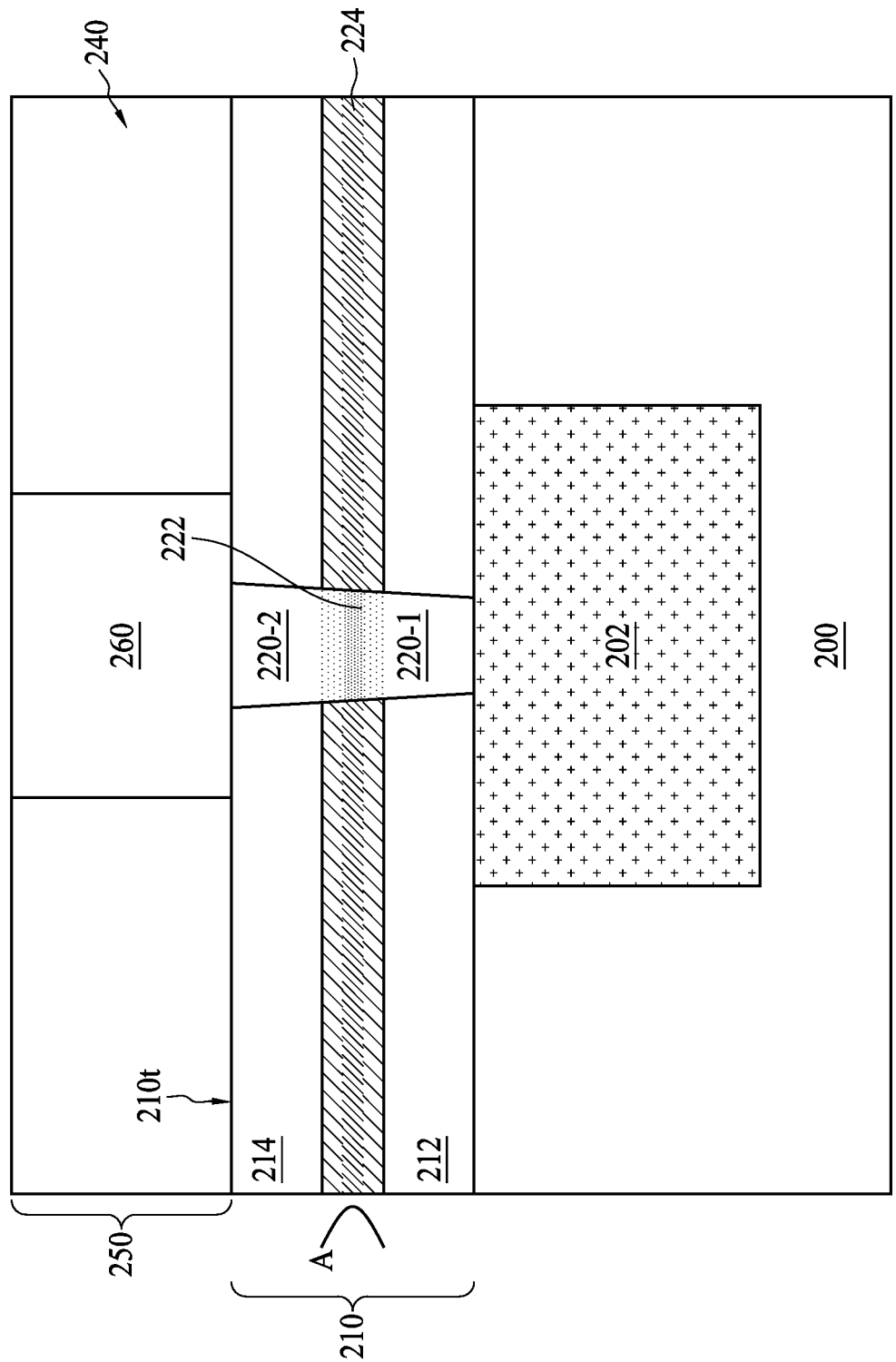

Referring to FIGS. 4D and 6C, in operation 14, a portion of the metal layer 220 is removed to expose the top surface 210t of the dielectric structure 210 and form a connecting structure 240. In some embodiments, a portion of the dielectric structure 210, such as a portion of the second dielectric layer 214, can be removed in operation 14. In some embodiments, the removal of the portion of the metal layer 220, the doped metal portion 222 and the portion of the dielectric structure 210 can be performed using a CMP operation.

Accordingly, a connecting structure 240 is obtained. As shown in FIG. 4D, the connecting structure 240 includes the dielectric structure 210 including the first dielectric layer 212 and the second dielectric layer 214 over the substrate 200 and the conductive feature 202, the metal layer 220 disposed in the dielectric structure 210, the doped metal portion 222, and the doped dielectric layer 224 disposed over the first dielectric layer 212. As mentioned above, the first dielectric layer 212 and the second dielectric layer 214 can include different dielectric materials. In some embodiments, the metal layer can be divided into two portions by the doped metal portion 222. For example, the metal layer 220 includes a first metal portion 220-1 in contact with the conductive feature 202, and a second metal portion 220-2 disposed over the first metal portion 220-1. Further, the doped metal portion 222 is disposed between the first metal portion 220-1 and the second metal portion 220-2. As mentioned above, the first metal portion 220-1, the second metal portion 220-2 and the doped metal portion 222 include a same noble metal material. The doped dielectric layer 224 and the second dielectric layer 214 include a same dielectric material. Further, the doped dielectric layer 224 and the doped metal portion 222 include same dopants.

As mentioned above, the doped dielectric layer 224 and the doped metal portion 222 are substantially aligned with each other. In some embodiments, a thickness of the doped dielectric layer 224 can be similar to a thickness of the doped metal portion 222, but the disclosure is not limited thereto. Further, a thickness of the first metal portion 220-1 can be greater than a thickness of the first dielectric layer 212, as shown in FIG. 4D, but the disclosure is not limited thereto. In some embodiments, a top surface of the doped metal portion 222 is in contact with the second metal portion 220-2, and a bottom surface of the doped metal portion 222 is in contact with the first metal portion 220-1. In some embodiments, the top surface and the bottom surface of the doped dielectric layer 224 are both in contact with the second dielectric layer 214. In other words, a portion of the second dielectric layer 214 is disposed between the doped dielectric layer 224 and the first dielectric layer 212. As shown in FIG. 4D, the top surface of the doped dielectric layer 224 is separated from the top surface 210t of the dielectric structure 210.

Figure 5:
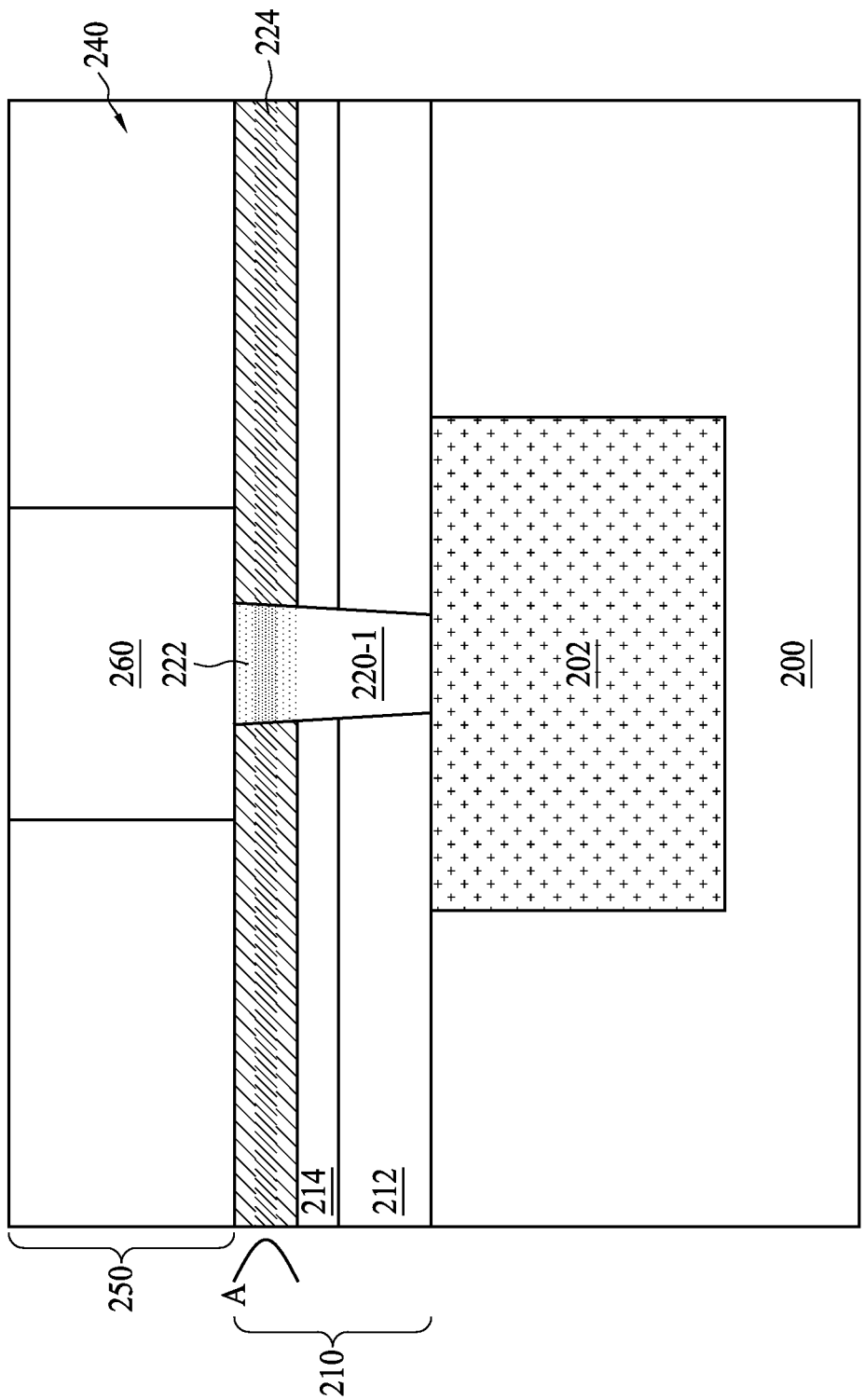
FIG. 5 is a drawing illustrating a semiconductor device according to aspects of one or more embodiments of the present disclosure.

In some embodiments, by removing a portion of the metal layer 220 and a portion of the second dielectric layer 214 in operation 14, the top surface of the doped metal portion 222 and the top surface of the doped dielectric layer 224 can be exposed, as shown in FIG. 5. In such embodiments, the connecting structure 240 may include the doped metal portion 222 disposed over the first metal portion 220-1, and the doped dielectric layer 224 disposed over the second dielectric layer 214 and the first dielectric layer 212. In some embodiments, the peak of the distribution curve of the dopants in the doped metal portion 222 may be observed below the top surface of the doped metal portion 222, as shown in FIG. 5, but the disclosure is not limited thereto. For example, in some embodiments, the peak of the distribution curve of the dopants in the doped metal portion 222 may be observed at the top surface of the doped metal portion 222.

Referring to FIG. 6C, in some embodiments, a connecting structure 240 can be obtained in operation 14. In such embodiments, the doped dielectric layer 224 is disposed between the first dielectric layer 212 and the second dielectric layer 214. A top surface of the doped dielectric layer 224 is in contact with the second dielectric layer 214, while a bottom surface of the doped dielectric layer 224 is in contact with the first dielectric layer 212. As shown in FIG. 6C, the top surface of the doped dielectric layer 224 is separated from the top surface 210t of the dielectric structure 210. Further, a thickness of the first metal portion 220-1 can be substantially the same as a thickness of the first dielectric layer 212, which is under the doped dielectric layer 224, as shown in FIG. 6C.

Figure 7:
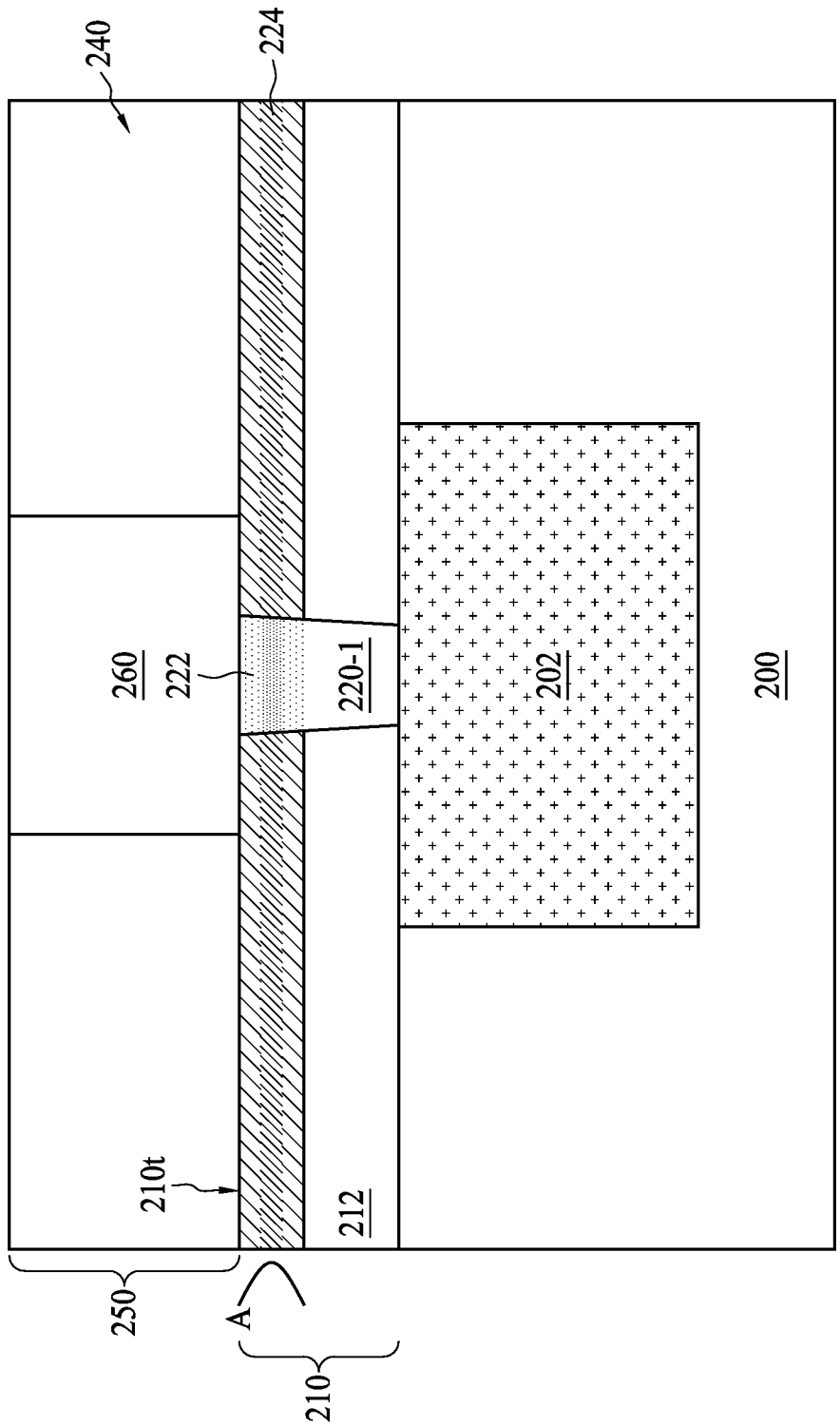
FIG. 7 is a schematic drawing illustrating a semiconductor device according to various aspects of the present disclosure.

In some embodiments, by removing a portion of the metal layer 220 and a portion of the second dielectric layer 214 in operation 14, the top surface of the doped metal portion 222 and the top surface of the doped dielectric layer 224 can be exposed, as shown in FIG. 7. In such embodiments, the connecting structure 240 may include the doped metal portion 222 disposed over the first metal portion 220-1, and the doped dielectric layer 224 disposed over the first dielectric layer 212. In some embodiments, the peak of the distribution curve of the dopants in the doped metal portion 222 may be observed below the top surface of the doped metal portion 222, as shown in FIG. 7, but the disclosure is not limited thereto. For example, in some embodiments, the peak of the distribution curve of the dopants in the doped metal portion 222 may be observed at the top surface of the doped metal portion 222.

Referring to FIGS. 4E, 5, 6D and 7, in some embodiments, another dielectric structure 250 can be formed over the dielectric structure 210 and the connecting structure 240.

Another conductive feature 260 can be formed in the dielectric structure 250. The conductive feature 260 can be coupled to the connecting structure 240. In some embodiments, the conductive feature 260 can be referred to as the connecting structures 140, 142 in FIG. 1. In some embodiments, the conductive feature 260 can be referred to as the metal line 150 in FIG. 1.

According to the method for forming the semiconductor device 10, the doped metal portion 222 is formed prior to the removing of the portion of the metal layer 220 and the portion of the dielectric structure 210. The doped metal portion 222 including dopants bonded to the metal material serves as a diffusion barrier layer, such that the metal diffusion can be obstructed or reduced, and the metal-loss issue can be mitigated or reduced. In some embodiments, as shown in FIGS. 4E, 5, 6D and 7, the doped dielectric layer 224 can be formed to serve as the diffusion barrier layer used to mitigate the metal-loss issue. As mentioned above, the thickness of the doped metal portion 222 and the doped dielectric layer 224 can be between approximately 1 nanometer and approximately 50 nanometers. When the thickness of the doped metal portion 222 and the thickness of the doped dielectric layer 224 are less than approximately 1 nanometer, the diffusion barrier layer may be too thin to obstruct the metal diffusion. In some alternative approaches, when the thickness of the doped metal portion 222 and the thickness of the doped dielectric layer 224 are greater than approximately 50 nanometers, such thickness may incur greater cost for the removal of the doped metal portion 222 and the doped dielectric layer 224.

Figure 8:
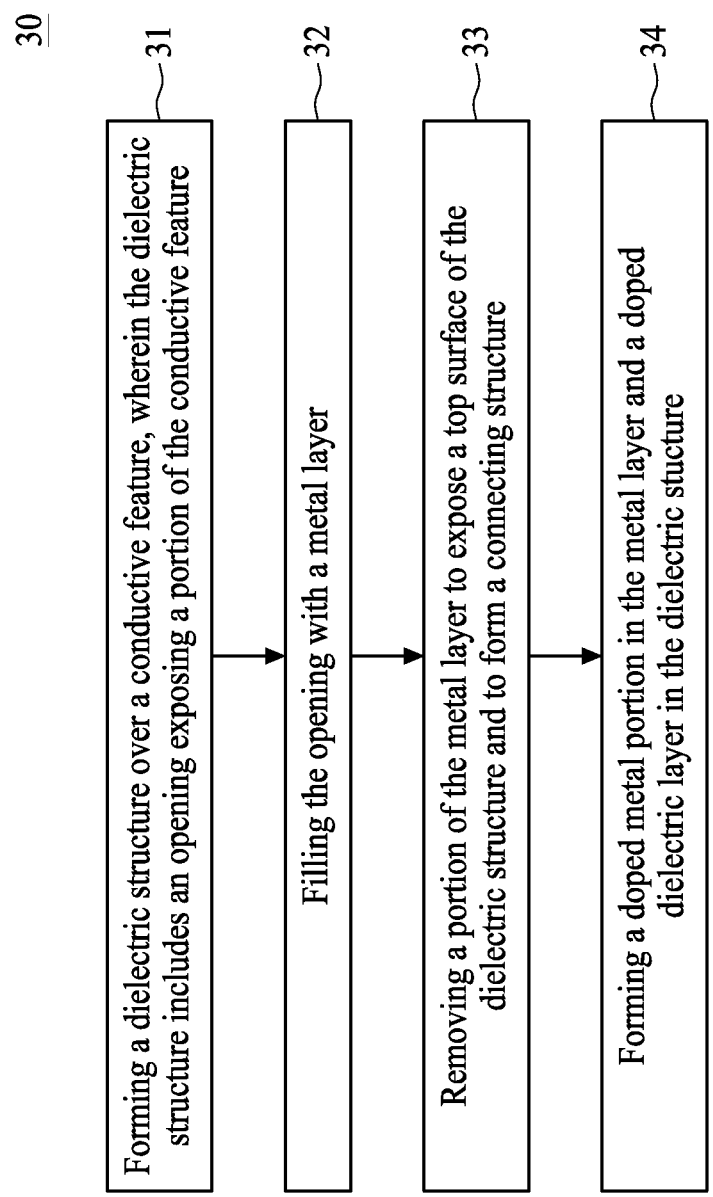
FIG. 8 is a flowchart of a method for forming a semiconductor device according to various aspects of the present disclosure.

FIG. 8 is a flowchart representing a method for forming a semiconductor device 30 according to aspects of the present disclosure. In some embodiments, the method for forming the semiconductor device 30 includes a number of operations (31, 32, 33 and 34). The method for forming the semiconductor device 30 will be further described according to one or more embodiments. It should be noted that the operations of the method for forming the semiconductor device 30 may be rearranged or otherwise modified within the scope of the various aspects. It should further be noted that additional processes may be provided before, during, and after the method 30, and that some other processes may be only briefly described herein.

Figure 9A:
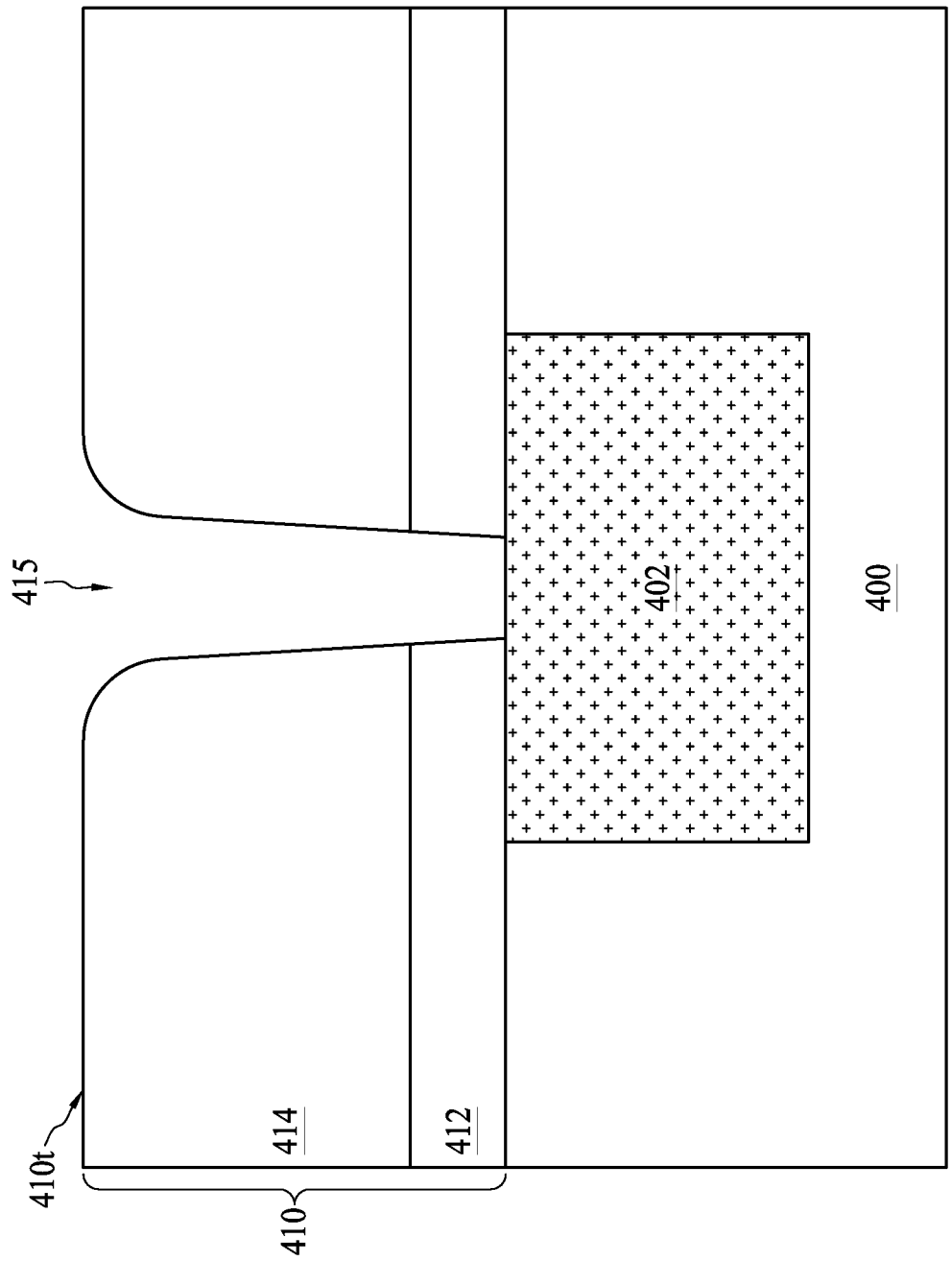

FIGS. 9A to 9F are schematic drawings illustrating various stages in the method for forming the semiconductor device 30 according to aspects of one or more embodiments of the present disclosure. In should be noted that same elements in FIGS. 3A to 3F and FIGS. 9A to 9F can include same materials, and repetitive details may be omitted in the interest of brevity. In some embodiments, a substrate 400 can be received. The substrate 400 can be the substrate 102 shown in FIG. 1, but the disclosure is not limited thereto. In some embodiments, the substrate 400 can include a semiconductor device, such as the transistor shown in FIG. 1, but the disclosure is not limited thereto. As shown in FIG. 9A, the substrate 400 may include a conductive feature 402 disposed therein. In some embodiments, the conductive feature 402 can be a FEOL feature similar to the metal gate 110 or the source/drain region S/D depicted in FIG. 1. In some embodiments, the conductive feature 402 can be a MEOL feature, such as a cobalt-containing device-level contact similar to the connecting structures 130, 132 depicted in FIG. 1. In other embodiments, the conductive feature 402 can be a BEOL feature, such as the cobalt-containing line of a metal line (M) feature 150 depicted in FIG. 1.

In operation 31, a dielectric structure 410 is formed over the substrate 400 and the conductive feature 402. In some embodiments, the dielectric structure 410 can include a single layer. In some embodiments, the dielectric structure can include a multilayered structure. For example, as shown in FIG. 9A, the dielectric structure 410 can include at least a first dielectric layer 412 and a second dielectric layer 414 sequentially stacked over the substrate 400 and the conductive feature 402. The first dielectric layer 412 and the second dielectric layer 414 can include different dielectric materials.

Still referring to FIG. 9A, in operation 31, an opening 415 can be formed in the dielectric structure 410. In some embodiments, the opening 415 penetrates the dielectric structure 410 from a top surface 410t to a bottom of the dielectric structure 410. Accordingly, a portion of the conductive feature 402 is exposed through the opening 415.

Figure 9B:
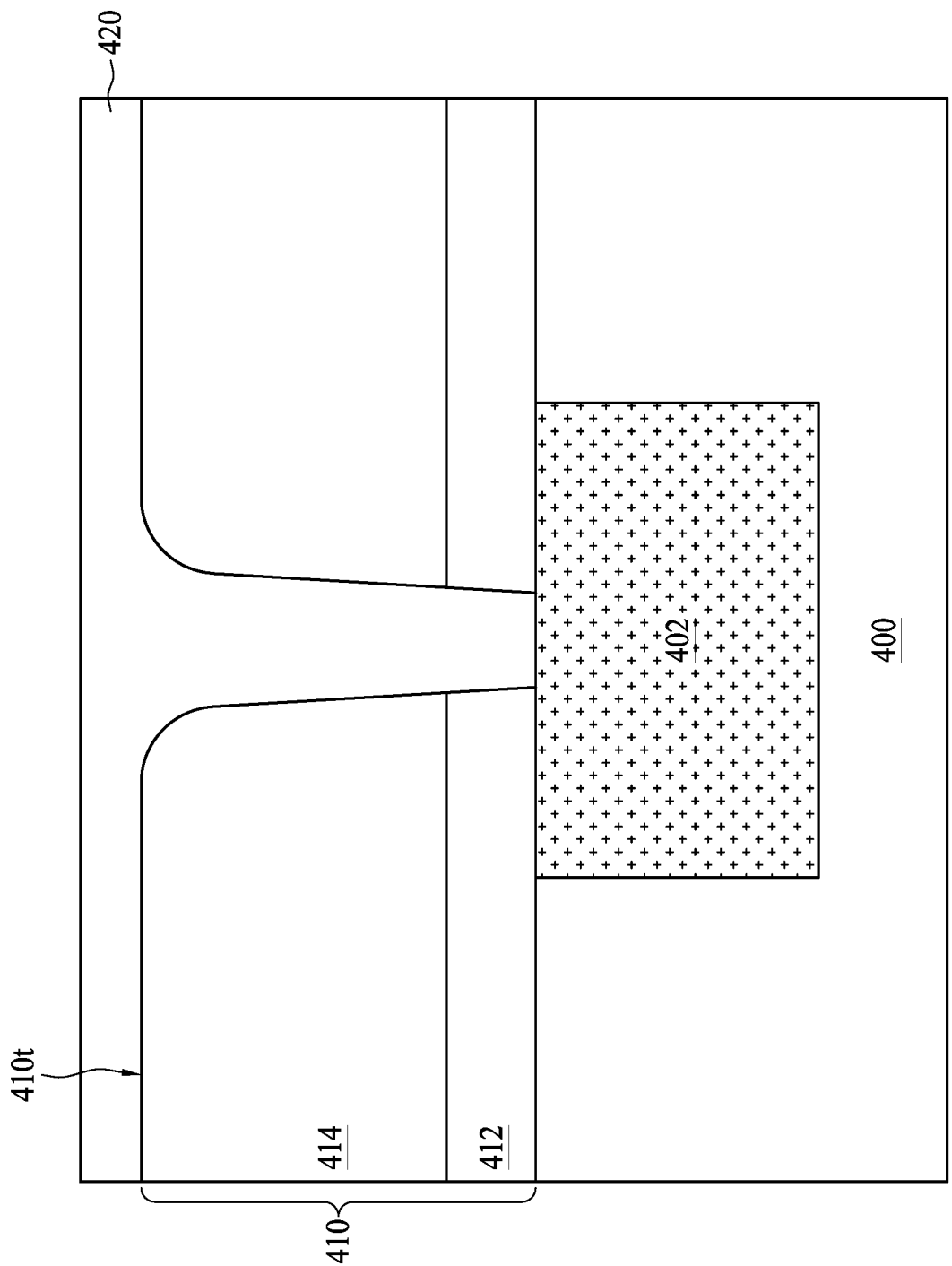

Referring to FIG. 9B, in operation 32, a metal layer 420, such as a noble metal layer, can be formed to fill the opening 415. The metal layer 420 extends from the top surface 410t of the dielectric structure 410 to the bottom of the dielectric structure 410. The metal layer 420 penetrates the second dielectric layer 414 and the first dielectric layer 412 to contact the exposed portion of the conductive feature 402. Further, the metal layer 420 covers the top surface 410t of the dielectric structure 410. It should be noted that in some embodiments, the metal layer 420 can be formed in absence of a liner, a barrier, a seed layer or any intervening layer. Therefore, in such embodiments, the metal layer 420 can be in contact with the dielectric structure 410, but the disclosure is not limited thereto.

Figure 9C:
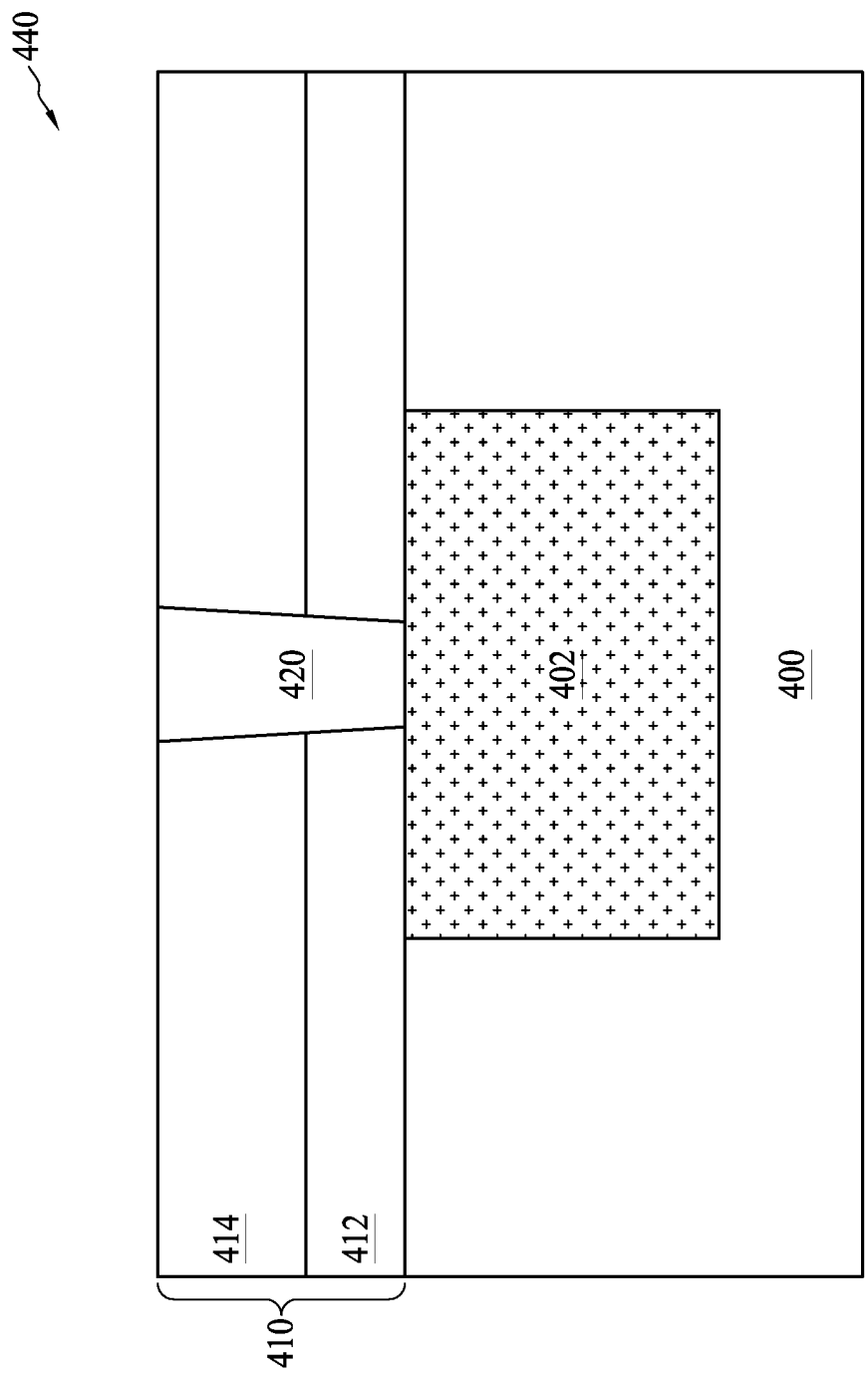

Referring to FIG. 9C, in operation 33, a portion of the metal layer 420 is removed to expose the top surface 410t of the dielectric structure 410 and form a connecting structure 440. In some embodiments, a portion of the dielectric structure 410, such as a portion of the second dielectric layer 414, can be removed in operation 33. In some embodiments, the removal of the portion of the metal layer 420 and the portion of the dielectric structure 410 can be performed using a CMP operation.

Figure 9D:
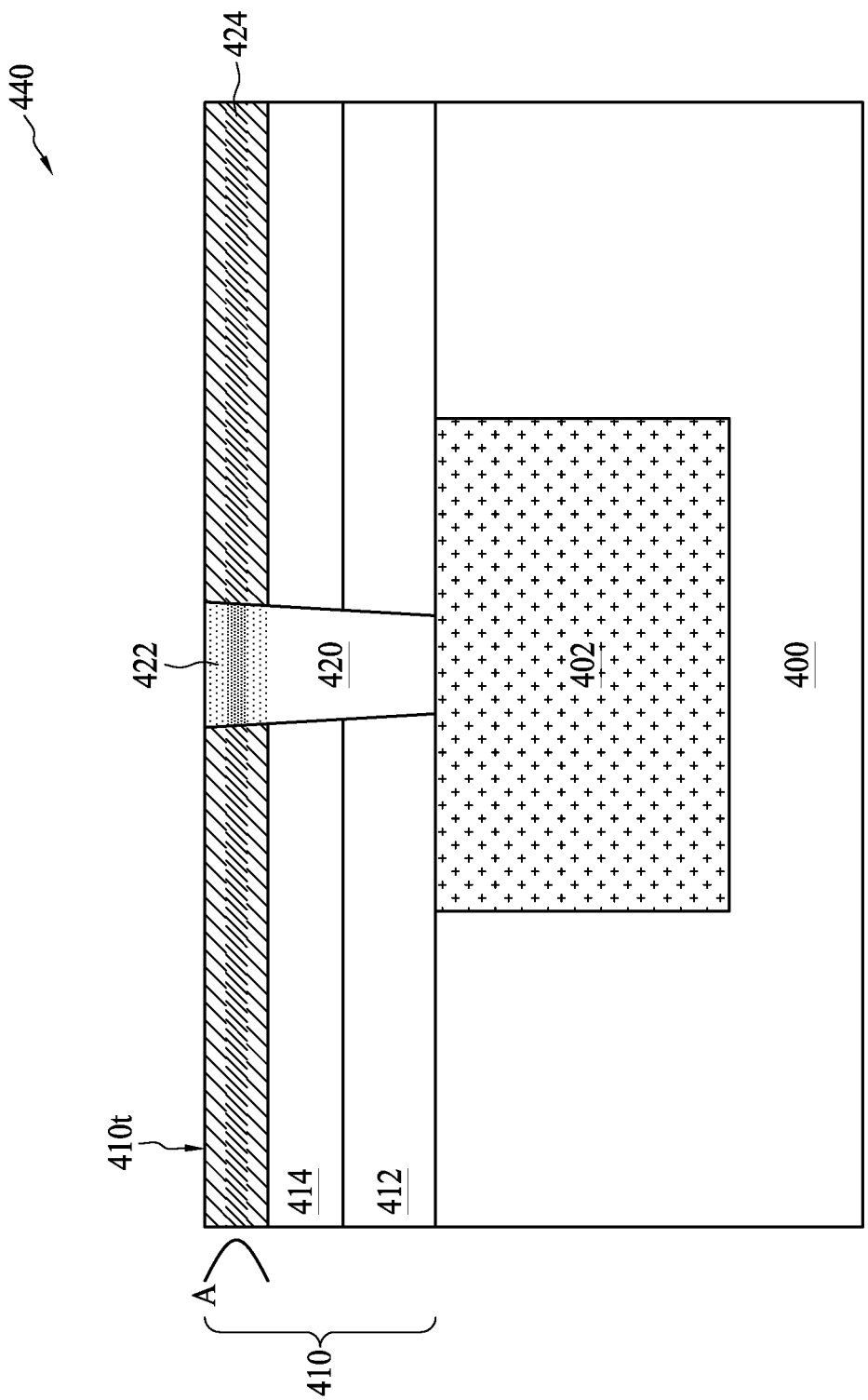

Referring to FIG. 9D, in operation 34, a doped metal portion 422 is formed in the metal layer 420 and a doped dielectric layer 424 is formed in the second dielectric layer 414 of the dielectric structure 410. In some embodiments, the doped metal portion 422 and the doped dielectric layer 424 are aligned with each other, but the disclosure is not limited thereto. In some embodiments, the doped metal portion 422 and the doped dielectric layer 424 include phosphorous (P), boron (B), arsenic (As), gallium (Ga), or indium (In), but the disclosure is not limited thereto. In some embodiments, the forming of the doped metal portion 422 and the doped dielectric layer 424 includes an ion implantation. A dosage of the ion implantation can be between approximately $1E13\ cm^{-2}$ and approximately $1E16\ cm^{-2}$. An angle of the ion implantation can be between approximately 0 degrees and approximately 60 degrees. In some embodiments, a temperature of the ion implantation can be between approximately $-100°$ C. and approximately $500°$ C. It should be noted that a depth or a location of the doped metal portion 422 can be determined by an implantation energy of the ion implantation. For example, when the implantation energy of the ion implantation is between approximately 500 eV and approximately 50 KeV, the doped metal portion 422 can be formed in an upper portion of the metal layer 420, and the doped dielectric layer 424 can be formed in an upper portion of the second dielectric layer 414. In some embodiments, as shown in FIG. 9D, a top surface of the doped metal portion 422 and a top surface of the doped dielectric layer 424 are exposed. A distribution of the dopants in the doped metal portion 422 in the doped dielectric layer 424 is depicted as the curve A shown in FIG. 9D. In some embodiments, a peak of the distribution curve can be near the middle of the doped metal portion 422 and the middle of the doped dielectric layer 424, but the disclosure is not limited thereto. In some embodiments, a thickness of the doped metal portion 422 can be between approximately 1 nanometer and approximately 30 nanometers, but the disclosure is not limited thereto. Further, a thickness of the doped dielectric layer 424 can be between approximately 1 nanometer and approximately 50 nanometers, but the disclosure is not limited thereto.

Figure 9E:
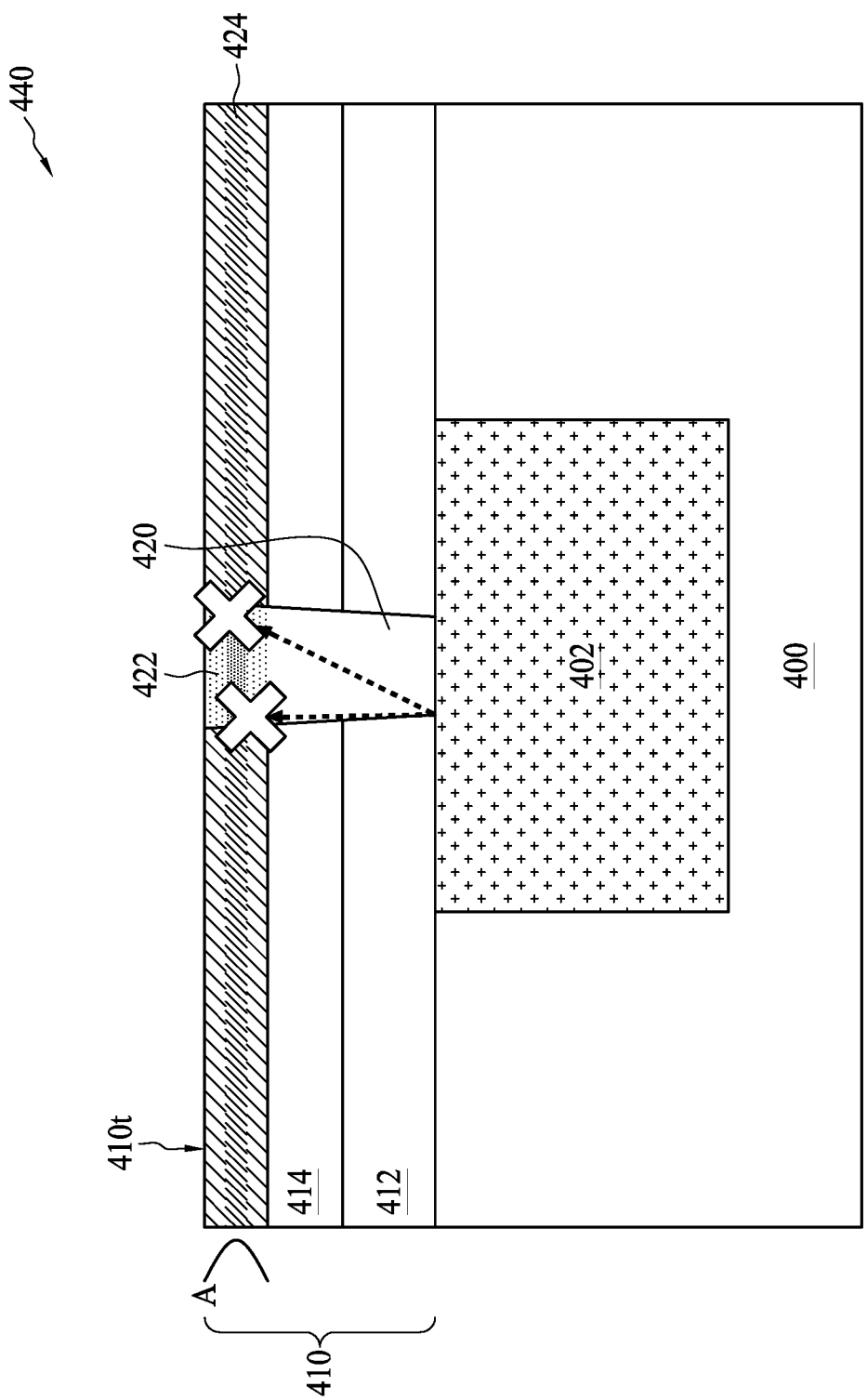

Referring to FIG. 9E, in some embodiments, an anneal is performed improve the gap-filling results, reduce plug resistance and fix an interface between the dielectric structure 410 and the metal layer 420. During the anneal, metal diffusion may occur, and metal ions may move from the conductive feature 402 to an upper portion of the metal layer 420 along the interface between the dielectric structure 410 and the metal layer 420, or within the metal layer 420. It should be noted that the doped metal portion 422 together with the doped dielectric layer 424 serve as a barrier layer that helps to obstruct or reduce the metal diffusion, as shown in FIG. 9E. Therefore, the metal loss issue can be mitigated or reduced.

According to the method for forming the semiconductor device 30, the doped metal portion 422 and the doped dielectric layer 424 can be formed after the removing of the portion of the metal layer 420 and the portion of the second dielectric layer 414. The doped metal portion 422 includes the ions that are able to be bonded to the metal layer, e.g., Ru. Therefore, the doped metal portion 422 may include ruthenium phosphides, ruthenium borides, and ruthenium arsenide, and serve as a diffusion barrier layer. Accordingly, the metal diffusion can be obstructed by the diffusion barrier layer, and the metal-loss issue can be mitigated. As mentioned above, the thickness of the doped metal portion 422 and the thickness of the doped dielectric layer 424 can be between approximately 1 nanometer and approximately 30 nanometers. When the thickness of the doped metal portion 422 and the thickness of the doped dielectric layer 424 are less than approximately 1 nanometer, the diffusion barrier layer may be too thin to obstruct the metal diffusion. In some alternative approaches, when the thickness of the doped metal portion 422 and the thickness of the doped dielectric layer 424 are greater than approximately 50 nanometers, such thickness may negatively impact the resistance of the conductive feature 402.

Figure 10A:
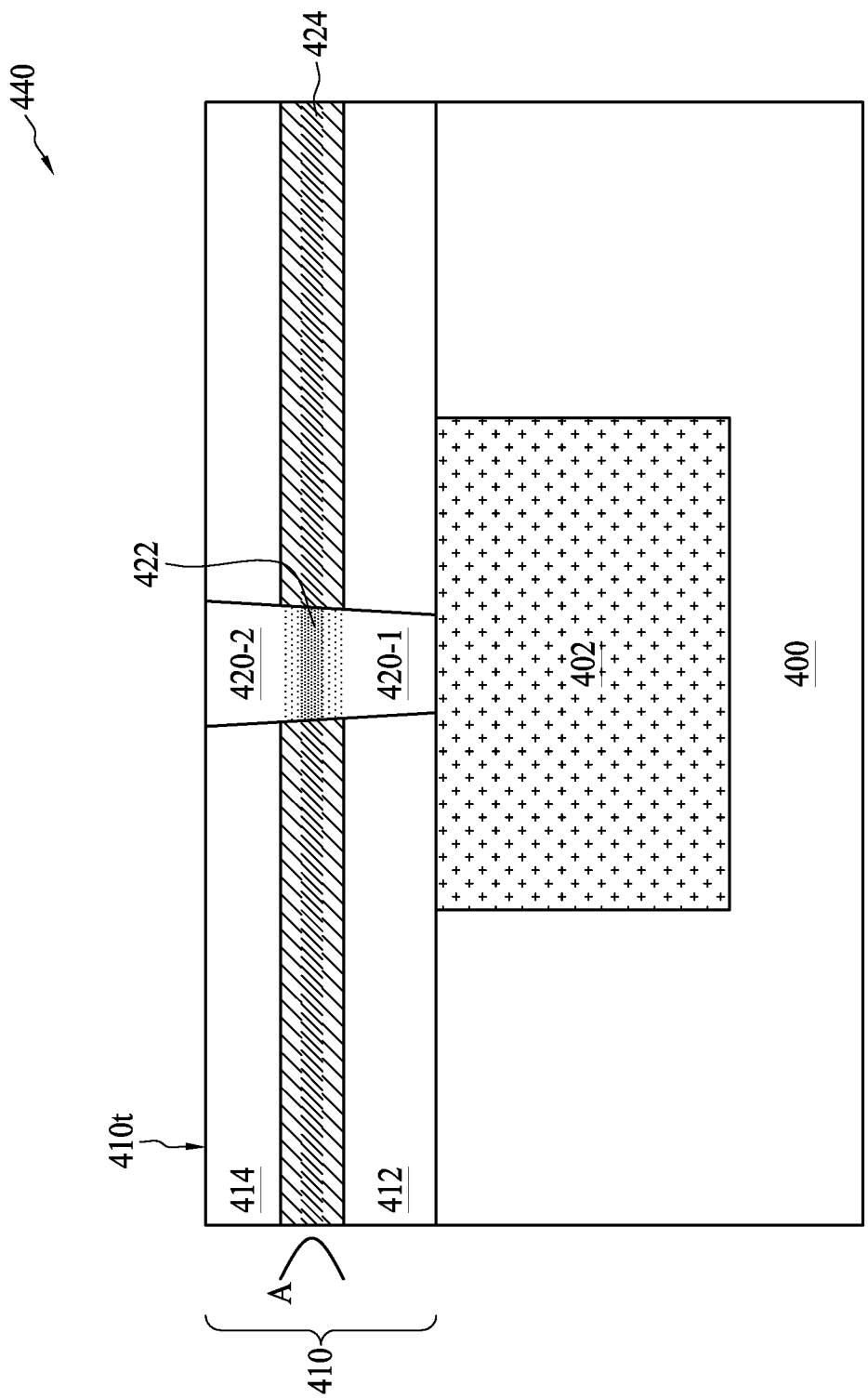
FIGS. 10A to 10C are schematic drawings illustrating various stages in a method for forming a semiconductor device according to aspects of one or more embodiments of the present disclosure.
Figure 10B:
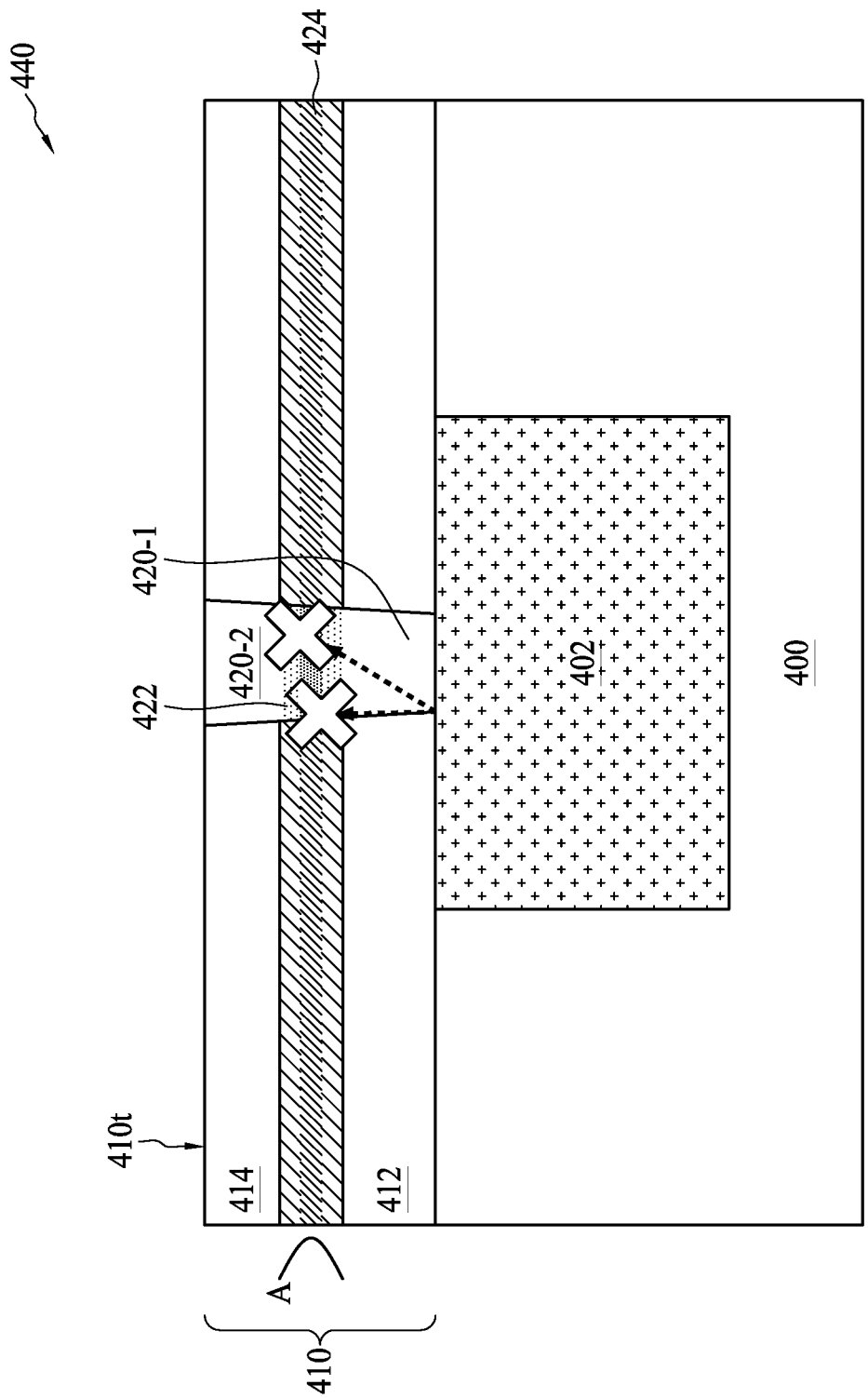
Figure 10C:
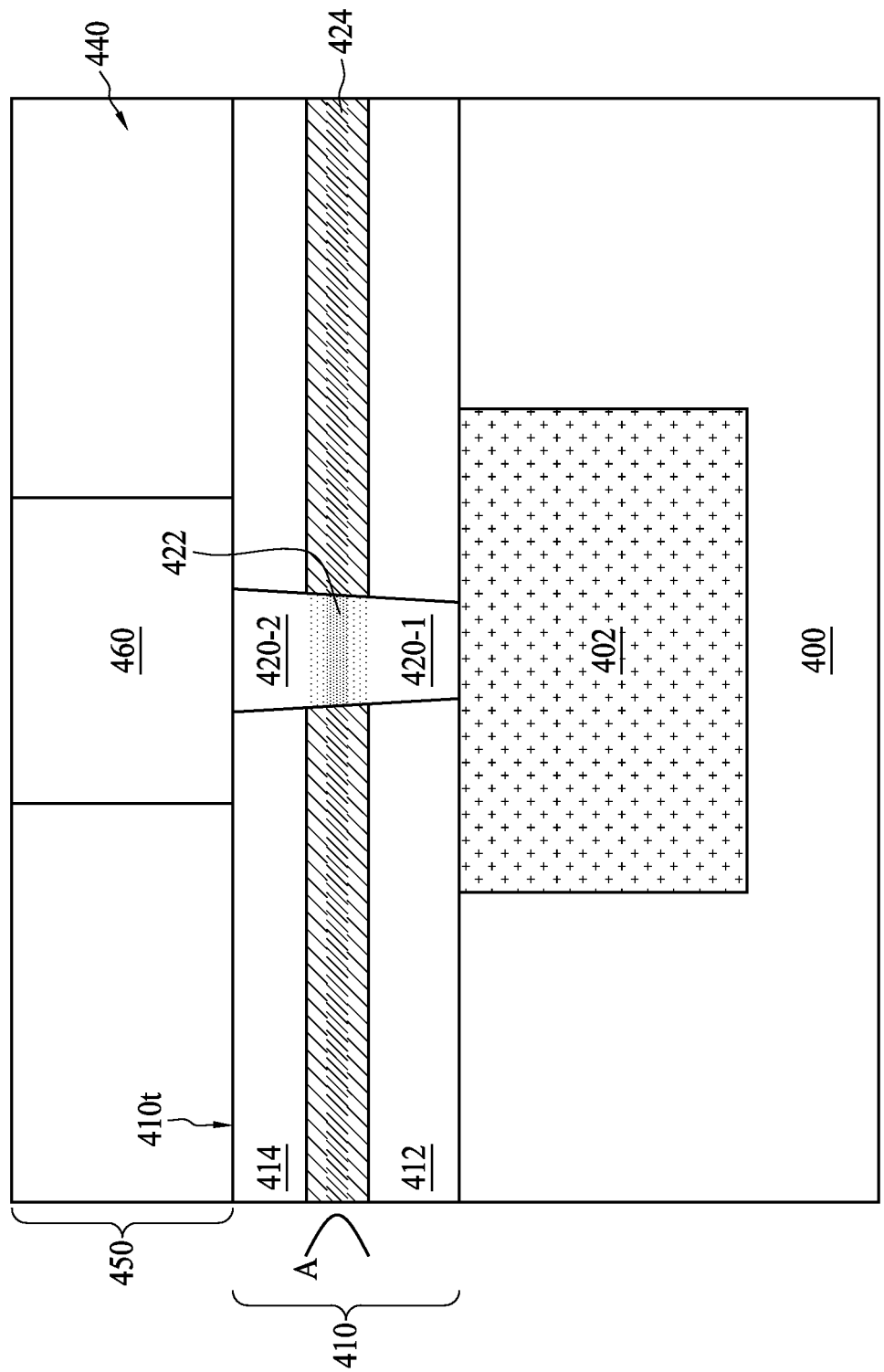

FIGS. 10A to 10C are schematic drawings illustrating various stages in the method for forming the semiconductor device 30 according to aspects of one or more embodiments of the present disclosure. The steps shown in FIGS. 10A to 10C may be performed after performing steps associated with FIGS. 9A to 9C. It should be understood that same elements in FIGS. 9A to 9F and FIGS. 10A to 10C are depicted by same numerals, and repetitive details may be omitted in the interest of brevity.

In some embodiments, a substrate 400 can be received. As shown in FIG. 10A, the substrate 400 may include a conductive feature 402 disposed therein. In operation 31, a dielectric structure 410 is formed over the substrate 400 and the conductive feature 402, and an opening can be formed in the dielectric structure 410. In operation 32, a metal layer 420, such as a noble metal layer, can be formed to fill the opening. As mentioned above, in some embodiments, the metal layer 420 can be formed in absence of a liner, a barrier, a seed layer or any intervening layer. Therefore, in such embodiments, the metal layer 420 can be in contact with the dielectric structure 410, but the disclosure is not limited thereto.

Referring to FIG. 10A, in operation 33, a portion of the metal layer 420 is removed to expose the top surface 410t of the dielectric structure 410 and form a connecting structure 440. In some embodiments, a portion of the dielectric structure 410, such as a portion of the second dielectric layer 414, can be removed in operation 33. In some embodiments, the removal of the portion of the metal layer 420 and the portion of the dielectric structure 410 can be performed using a CMP operation.

In operation 34, a doped metal portion 422 is formed in the metal layer 420 and a doped dielectric layer 424 is formed in the dielectric structure 410. In some embodiments, the forming of the doped metal portion includes an ion implantation. A dosage, an angle and a temperature used in the ion implantation can be similar to those described above; therefore, details are omitted for brevity. It should be noted that depths or locations of the doped metal portion 422 and the doped dielectric layer 424 can be determined by an implantation energy of the ion implantation. For example, by adjusting the implantation energy, the doped metal portion 422 and the doped dielectric layer 424 can be formed away from the top surface 410t of the dielectric structure 410 or in a lower portion of the second dielectric layer 414. In some embodiments, by adjusting the implantation energy, the doped dielectric layer 424 can be formed in both of the first dielectric layer 412 and the second dielectric layer 414, as shown in FIG. 10A. However, it should be noted that by controlling or adjusting the implantation energy of the ion implantation, the doped metal portion 422 and the doped dielectric layer 424 are separated from the conductive feature 402. In some comparative approaches, when the doped metal portion 422 is in contact with the conductive feature 402, the resistance of the conductive feature 402 may be negatively impacted.

Referring to FIG. 10B, in some embodiments, an anneal is performed to improve the gap-filling results, reduce plug resistance and fix an interface between the dielectric structure 410 and the metal layer 420. During the anneal, metal diffusion may occur, and metal ions may move from the conductive feature 402 to an upper portion of the metal layer 420 along the interface between the dielectric structure 410 and the metal layer 420, or within the metal layer 420. It should be noted that the doped metal portion 422 and the doped dielectric layer 424 serve as a barrier layer that helps to obstruct or reduce the metal diffusion, as shown in FIG. 10B. Therefore, the metal-loss issue can be mitigated or reduced.

Referring to FIGS. 9F and 10C, in some embodiments, another dielectric structure 450 can be formed over the dielectric structure 410 and the connecting structure 440. Another conductive feature 460 can be formed in the dielectric structure 450. The conductive feature 460 can be coupled to the connecting structure 440. In some embodiments, the conductive feature 460 can be referred to as the connecting structures 140, 142 in FIG. 1. In some embodiments, the conductive feature 460 can be referred to as the metal line 150 in FIG. 1.

Accordingly, a connecting structure 440 is obtained, as shown in FIG. 9E or FIG. 10B. The connecting structure 440 includes the dielectric structure 410 including the first dielectric layer 412 and the second dielectric layer 414 over the substrate 400 and the conductive feature 402, the metal layer 420 disposed in the dielectric structure 410, the doped metal portion 422, and the doped dielectric layer 424. In some embodiments, the top surface of the doped metal portion 422 and the top surface of the doped dielectric layer 424 form a top surface of the connecting structure 440, as shown in FIG. 9E. In such embodiments, the second dielectric layer 414 can be disposed between the doped dielectric layer 424 and the first dielectric layer 412. Therefore, a bottom surface of the doped dielectric layer 424 is in contact with the second dielectric layer 414. Further, the doped metal portion 422 is separated from the conductive feature 402 by the metal layer 420.

In other embodiments, as mentioned above, the metal layer 420 can be divided into two portions by the doped metal portion 422. For example, the metal layer includes a first metal portion 420-1 in contact with the conductive feature 402, and a second metal portion 420-2 disposed over the first metal portion 420-1. Further, the doped metal portion 422 including dopants bonded to the metal material is disposed between the first metal portion 420-1 and the second metal portion 420-2. In such embodiments, the doped dielectric layer 424 is disposed between the first dielectric layer 412 and the second dielectric layer 414. In some embodiments, a thickness of the first metal portion 420-1 can be greater than a thickness of the first dielectric layer 412, as shown in FIG. 9E. In other embodiments, the thickness of the first metal portion 420-1 can be substantially the same as the thickness of the first dielectric layer 412, which is under the doped dielectric layer 414, as shown in FIG. 10B. In some embodiments, the top surface of the doped metal portion 422 is separated from the top surface of the connecting structure 440 by the second metal portion 420-2, and the top surface of the doped dielectric layer 424 is separated from the top surface 410t of the dielectric structure 410 and the top surface of the connecting structure 440 by the second dielectric layer 414, as shown in FIG. 10B. In such embodiments, the top surface of the doped metal portion 422 is in contact with the second metal portion 420-2 and a bottom surface of the doped metal portion 422 is in contact with the first metal portion 420-1. The top surface of the doped dielectric layer 424 is in contact with the second dielectric layer 424, and a bottom surface of the doped dielectric layer 424 is in contact with the first dielectric layer 412.

As mentioned above, the doped dielectric layer 424 and the doped metal portion 422 are substantially aligned with each other. In some embodiments, a thickness of the doped dielectric layer 424 can be similar to a thickness of the doped metal portion 422, but the disclosure is not limited thereto.

According to the method for forming the semiconductor device 30, the doped metal portion 422 and the doped dielectric layer 424 can be formed after the removing of the portion of the metal layer 420 and the portion of the second dielectric layer 414. The doped metal portion 422 including dopants bonded to the metal material serves as a diffusion barrier layer, such that the metal diffusion can be obstructed, and the metal-loss issue can be mitigated. As mentioned above, the thickness of the doped metal portion 422 and the thickness of the doped dielectric layer 424 can be between approximately 1 nanometer and approximately 30 nanometers. When the thickness of the doped metal portion 422 and the thickness of the doped dielectric layer 424 are less than approximately 1 nanometer, the diffusion barrier layer may be too thin to obstruct the metal diffusion. In some alternative approaches, when the thickness of the doped metal portion 422 and the thickness of the doped dielectric layer 424 are greater than approximately 50 nanometers, such thickness may negatively impact the resistance of the conductive feature 402.

Briefly speaking, embodiments of the present disclosure provide a semiconductor device including a connecting structure and a method for forming a semiconductor device to mitigate the bottom metal-loss issue. In some embodiments, an ion implantation is performed after the disposing of the metal layer to form a barrier layer in the conductive material. The ion implantation can be performed before or after the removing of the superfluous metal layer. In some embodiments, ions implanted into the conductive material are bonded to the conductive material to form the diffusion barrier layer, such that metal diffusion can be obstructed by the barrier layer. Accordingly, the bottom metal-loss issue caused by metal diffusion can be mitigated.

In some embodiments, a semiconductor device is provided. The semiconductor device includes a first dielectric layer disposed over a substrate and a conductive feature, a doped dielectric layer disposed over the first dielectric layer, a first metal portion disposed in the first dielectric layer and in contact with the conductive feature, and a doped metal portion disposed over the first metal portion. In some embodiments, the first metal portion and the doped metal portion include a same noble metal material. In some embodiments, the doped dielectric layer and the doped metal portion include same dopants. In some embodiments, the dopants are bonded to the noble meal material in the doped metal portion.

In some embodiments, a method for forming a semiconductor device is provided. The method includes following operations. A dielectric structure is formed over a conductive feature. The dielectric structure includes an opening exposing a portion of the conductive feature. The opening is filled with a metal layer. A doped metal portion is formed in the metal layer. A portion of the metal layer is removed to expose a top surface of the dielectric structure and form the connecting structure.

In some embodiments, a method for forming a semiconductor device is provided. The method includes following operations. A dielectric structure is formed over a conductive feature. The dielectric structure includes an opening exposing a portion of the conductive feature. The opening is filled with a metal layer. The metal layer covers a top surface of the dielectric structure. A portion of the metal layer is removed to expose the top surface of the dielectric structure. A doped metal portion is formed in the metal layer and a doped dielectric layer is formed in the dielectric structure after the removing of the portion of the metal layer. The metal layer and the doped metal portion include a same metal material. The doped metal portion and the doped dielectric layer include same dopants. The dopants are bonded to the metal material in the doped metal portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first dielectric layer disposed over a substrate and a conductive feature;
   a doped dielectric layer disposed over the first dielectric layer;
   a first metal portion disposed in the first dielectric layer and in contact with the conductive feature; and
   a doped metal portion disposed over the first metal portion, wherein the first metal portion and the doped metal portion comprise a same noble metal material, the doped dielectric layer and the doped metal portion comprise same dopants, wherein the dopants are bonded to the noble metal material in the doped metal portion.

2. The semiconductor device of claim 1, wherein the doped dielectric layer and the doped metal portion are substantially aligned with each other.

3. The semiconductor device of claim 1, wherein the doped dielectric layer is in contact with the first dielectric layer.

4. The semiconductor device of claim 1, further comprising a second dielectric layer disposed over the substrate, wherein the first dielectric layer comprises a first dielectric material, the second dielectric layer and the doped dielectric layer comprise a second dielectric material, and the first dielectric material and the second dielectric material are different.

5. The semiconductor device of claim 4, wherein the second dielectric layer is disposed between the doped dielectric layer and the first dielectric layer.

6. The semiconductor device of claim 4, wherein the doped dielectric layer is disposed between the second dielectric layer and the first dielectric layer.

7. The semiconductor device of claim 1, further comprising a second metal portion disposed over the substrate, wherein the second metal portion comprises the same noble metal material as the first metal portion.

8. The semiconductor device of claim 7, wherein the doped metal portion is disposed between the second metal portion and the first metal portion.

9. The semiconductor device of claim 1, wherein the dopants comprise phosphorous (P), boron (B), arsenic (As), gallium (Ga), or indium (In).

10. A method for forming a semiconductor device, comprising:
    forming a dielectric structure over a conductive feature, wherein the dielectric structure comprises an opening exposing a portion of the conductive feature;
    filling the opening with a metal layer comprising a noble metal material;
    forming a doped metal portion in the metal layer, wherein the doped metal portion comprises dopants bonded to the metal material; and
    removing a portion of the metal layer to expose a top surface of the dielectric structure and form a connecting structure.

11. The method of claim 10, wherein the noble metal material comprises rhenium (Re), rhodium (Rh) and ruthenium (Ru).

12. The method of claim 11, wherein the dopants comprise phosphorous, boron, arsenic or nitrogen.

13. The method of claim 10, wherein the doped metal portion covers the top surface of the dielectric structure, and the doped metal portion is removed to expose the top surface of the dielectric structure during the removing of the portion of the metal layer.

14. The method of claim 13, wherein the forming of the doped metal portion comprises an ion implantation, and an implantation energy of the ion implantation is between approximately 500 eV and approximately 50 KeV.

15. The method of claim 10, further comprising forming a doped dielectric layer in the dielectric structure simultaneously with the forming of the doped metal portion, wherein the doped dielectric layer and the doped metal portion are substantially aligned with each other.

16. The method of claim 15, wherein the forming of the doped metal portion and the forming of the doped dielectric layer comprise an ion implantation using an implantation energy greater than approximately 50 KeV.

17. The method of claim 15, wherein the doped metal portion is separated from a top surface of the metal layer, and the doped dielectric layer is separated from the top surface of the dielectric structure.

18. A method for forming a semiconductor device, the method comprising:

forming a dielectric structure over a conductive feature, wherein the dielectric structure comprises an opening exposing a portion of the conductive feature;

filling the opening with a metal layer, wherein the metal layer is a metal, wherein the metal layer covers a top surface of the dielectric structure;

removing a portion of the metal layer to expose the top surface of the dielectric structure; and after removing the portion of the metal layer, forming a doped metal portion in the metal layer and a doped dielectric layer in the dielectric structure, wherein the metal layer and the doped metal portion comprise a same metal material, the doped metal portion and the doped dielectric layer comprise same dopants, and the dopants are bonded to the metal material in the doped metal portion.

19. The method of claim 18, wherein the metal material comprises a noble metal material.

20. The method of claim 18, wherein the dopants comprise phosphorous (P), boron (B), arsenic (As), gallium (Ga), or indium (In).

* * * * *